US012245428B2

(12) United States Patent
Lue et al.

(10) Patent No.: US 12,245,428 B2
(45) Date of Patent: Mar. 4, 2025

(54) 3D AND FLASH MEMORY DEVICE AND METHOD OF FABRICATING THE SAME

(71) Applicant: MACRONIX International Co., Ltd., Hsinchu (TW)

(72) Inventors: Hang-Ting Lue, Hsinchu (TW); Chia-Jung Chiu, Hsinchu County (TW); Teng-Hao Yeh, Hsinchu County (TW); Guan-Ru Lee, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 508 days.

(21) Appl. No.: 17/575,418

(22) Filed: Jan. 13, 2022

(65) Prior Publication Data

US 2023/0225126 A1    Jul. 13, 2023

(51) Int. Cl.
*H10B 41/27*     (2023.01)
*H10B 41/10*     (2023.01)
*H10B 43/10*     (2023.01)
*H10B 43/27*     (2023.01)
*H01L 21/786*    (2006.01)

(52) U.S. Cl.
CPC ............ *H10B 43/27* (2023.02); *H10B 41/10* (2023.02); *H10B 41/27* (2023.02); *H10B 43/10* (2023.02); *H01L 21/786* (2013.01)

(58) Field of Classification Search
CPC ........ H10B 43/27; H10B 41/10; H10B 41/27; H10B 43/10; H10B 43/20; H10B 41/00–70; H10B 43/00–50; H01L 21/786; H01L 29/40117; H01L 29/792
See application file for complete search history.

(56) References Cited

U.S. PATENT DOCUMENTS 9,589,979 B2    3/2017   Hong
2014/0264897 A1 9/2014   Chiu et al.

OTHER PUBLICATIONS

H.-T. Lue et al., "3D AND: A 3D Stackable Flash Memory Architecture to Realize High-Density and Fast-Read 3D NOR Flash and Storage-Class Memory," 2020 IEEE International Electron Devices Meeting (IEDM), San Francisco, CA, USA, 2020, pp. 6.4.1-6.4.4, doi: 10.1109/IEDM13553.2020.9372101. (Year: 2020).*
"Notice of allowance of Taiwan Counterpart Application", issued on Jun. 20, 2023, p. 1-p. 3.

* cited by examiner

*Primary Examiner* — Matthew C Landau
*Assistant Examiner* — Jesse S Kysar
(74) *Attorney, Agent, or Firm* — J.C. PATENTS

(57) ABSTRACT

A three-dimensional AND flash memory device includes a gate stack structure, a charge storage structure, a first conductive pillar and a second conductive pillar, an insulating pillar, and a channel pillar. The gate stack structure includes gate layers and insulating layers stacked alternately with each other. The first and second conductive pillars extend through the gate stack structure. The channel pillar extends through the gate stack structure. The charge storage structure is disposed between the gate stack structure and the channel pillar. The channel pillar includes: a first part and a second part connected each other. The first part is located between the charge storage structure and the insulating pillar. The second part includes a first region electrically connected to the first conductive pillar, and a second region electrically connected to the second conductive pillar. A curvature of the first part is smaller than a curvature of the second part.

11 Claims, 34 Drawing Sheets

3D AND FLASH MEMORY DEVICE AND METHOD OF FABRICATING THE SAME

BACKGROUND

Technical Field

The embodiment of the disclosure relates to a semiconductor device and a method of fabricating the same, and particularly, to a 3D AND flash memory device and a method of fabricating the same.

Description of Related Art

Since a non-volatile memory has the advantage that stored data does not disappear at power-off, it becomes a widely used memory for a personal computer or other electronics equipment. Currently, the three-dimensional (3D) memory commonly used in the industry includes a NOR memory and a NAND memory. In addition, another type of 3D memory is an AND memory, which can be applied to a multi-dimensional memory array with high integration and high area utilization, and has an advantage of a fast operation speed. Therefore, the development of a 3D memory device has gradually become the current trend.

SUMMARY

The disclosure provides a three-dimensional AND flash memory device capable of reducing the electric field effect in the channel region.

The disclosure provides a method of fabricating a three-dimensional AND flash memory device capable of reducing damage to a channel pillar by etching.

An embodiment of the disclosure provides a three-dimensional AND flash memory device, including a gate stack structure, a charge storage structure, a first conductive pillar and a second conductive pillar, an insulating pillar, and a channel pillar. The gate stack structure is located on a surface of a dielectric substrate. The gate stack structure includes a plurality of gate layers and a plurality of insulating layers alternately stacked with each other. The first conductive pillar and the second conductive pillar extend through the gate stack structure. The insulating pillar separates the first conductive pillar and the second conductive pillar. The channel pillar extends through the gate stack structure. The charge storage structure is disposed between the gate stack structure, and the channel pillar, and the channel pillar, the first and the second conductive pillars and the insulating pillar are enclosed by and in the charge storage structure. The channel pillar includes a first part and a second part connected each other. The first part is located between the charge storage structure and the insulating pillar. The second part includes a first region electrically connected to the first conductive pillar, and a second region electrically connected to the second conductive pillar. A curvature of the first part is smaller than a curvature of the second part.

An embodiment of the disclosure provides a method of fabricating a three-dimensional AND flash memory device, including the following steps. A stack structure is formed on a surface of a dielectric substrate, wherein the stack structure comprises a plurality of sacrificial layers and a plurality of insulating layers stacked alternately with each other. An opening is formed in the stack structure. A channel pillar is formed in the opening, the channel pillar comprising a first part and a second part, wherein a curvature of the first part is smaller than a curvature of the second part. The opening is filled with a filling layer. A first hole is formed in the filling layer and the filling layer around the first hole is removed to expand the first hole to form a second hole. An insulating pillar is formed by filling the second hole with an insulating material. A first conductive pillar and a second conductive pillar are formed on both sides of the insulating pillar. The plurality of sacrificial layers is removed to form a plurality of horizontal openings. A plurality of gate layers is formed in the plurality of horizontal openings. At least one charge storage structure is formed between the plurality of gate layers and the channel pillar.

An embodiment of the disclosure provides a three-dimensional AND flash memory device, including a gate stack structure, a channel pillar, a charge storage structure, an insulating pillar, and a source pillar and a drain pillar. The gate stack structure is located on a surface of a dielectric substrate, and the gate stack structure includes a plurality of gate layers and a plurality of insulating layers alternately stacked with each other. The channel pillar extends through the gate stack structure, and a projection of the channel pillar on the surface of the dielectric substrate has an elliptical profile. The charge storage structure is located between the gate layers and the channel pillar. The insulating pillar is located in the channel pillar. The source pillar and the drain pillar are disposed on a long axis of the elliptical profile and extend through the gate stack structure, are surrounded by the charge storage structure and separated by the insulating pillar, and are electrically connected to the channel pillar.

Based on the above, in the embodiments of the disclosure, the first part of the channel pillar that serves as the channel region has a smaller curvature, which can reduce the effect of the electric field and reduce the disturbance to the current in its traveling direction. Therefore, it is possible to improve the accuracy of memory reading. Moreover, in the method of fabricating a three-dimensional AND flash memory device of the embodiment of the disclosure, it is possible to reduce the damage to the channel pillar by etching.

DESCRIPTION OF THE EMBODIMENTS

Figure 1A:
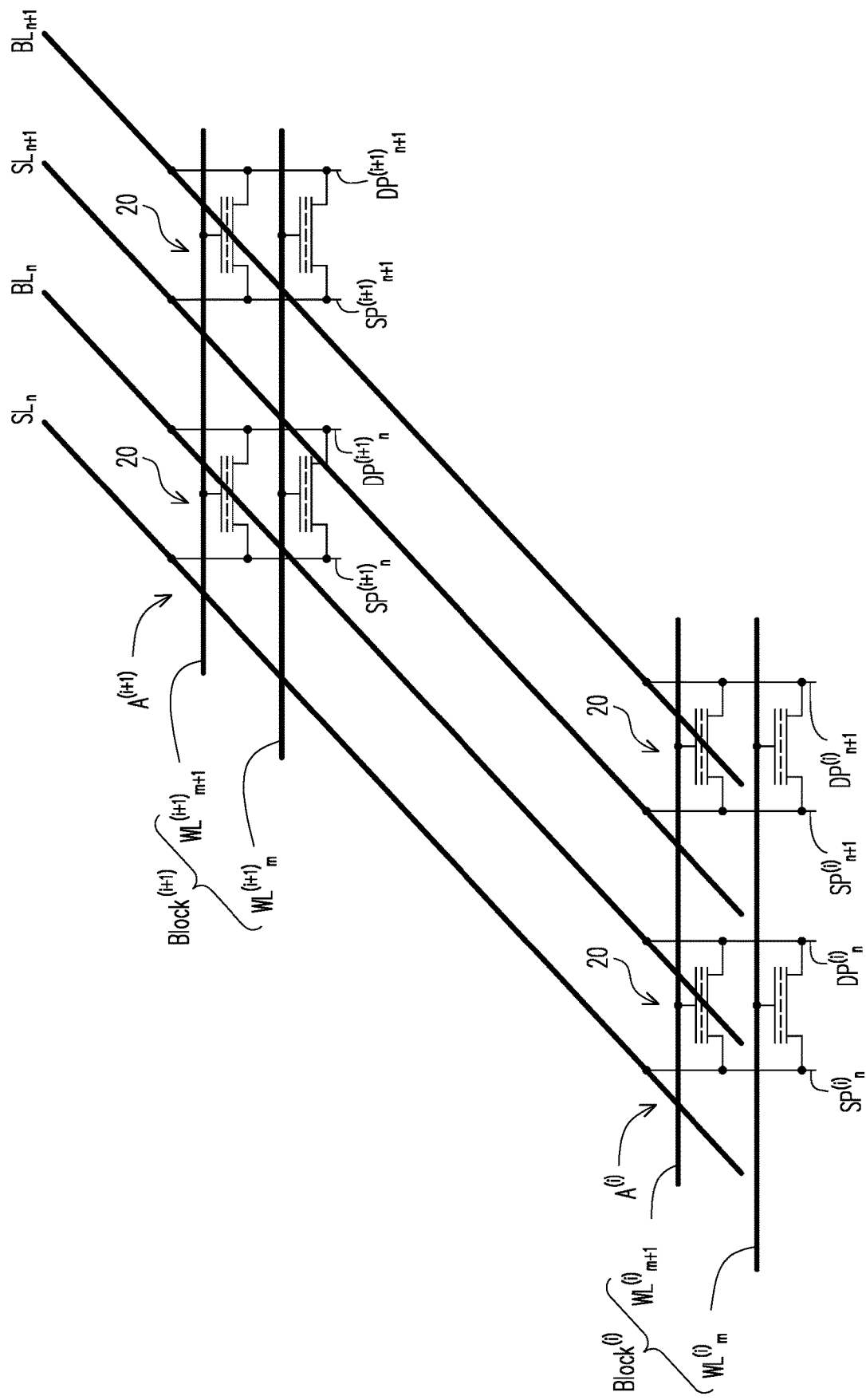
FIG. 1A shows a circuit diagram of a 3D AND flash memory array according to some embodiments.

FIG. 1A shows a schematic view of two blocks BLOCK$^{(i)}$ and BLOCK$^{(i+1)}$ of a vertical AND memory array 10 arranged in rows and columns. The block BLOCK$^{(i)}$ includes a memory array A$^{(i)}$. A row (e.g., an (m+1)$^{th}$ row) of the memory array A$^{(i)}$ is a set of AND memory cells 20 having a common word line (e.g., WL$^{(i)}_{m+1}$). The AND memory cells 20 of the memory array A$^{(i)}$ in each row (e.g., the (m+1)$^{th}$ row) correspond to a common word line (e.g., WL$^{(i)}_{m+i}$) and are coupled to different source pillars (e.g., SP$^{(i)}_n$ and SP$^{(i)}_{n+1}$) and drain pillars (e.g., DP$^{(i)}_n$ and DP$^{(i)}_{n+1}$), so that the AND memory cells 20 are logically arranged in a row along the common word line (e.g., WL$^{(i)}_{m+1}$).

A column (e.g., an n$^{th}$ column) of the memory array A$^{(i)}$ is a set of AND memory cells 20 having a common source pillar (e.g., SP$^{(i)}_n$) and a common drain pillar (e.g., DP$^{(i)}_n$). The AND memory cells 20 of the memory array A$^{(i)}$ in each column (e.g., the n$^{th}$ column) correspond to different word lines (e.g., WL$^{(i)}_{m+1}$ and WL$^{(i)}_m$) and are coupled to a common source pillar (e.g., SP$^{(i)}_n$) and a common drain pillar (e.g., DP$^{(i)}_n$). Hence, the AND memory cells 20 of the memory array A$^{(i)}$ are logically arranged in a column along the common source pillar (e.g., SP$^{(i)}_n$) and the common drain pillar (e.g., DP$^{(i)}_n$). In the physical layout, according to the fabrication method as applied, the columns or rows may be twisted and arranged in a honeycomb pattern or other patterns for high density or other reasons.

In FIG. 1A, in the block BLOCK$^{(i)}$, the AND memory cells 20 in the n$^{th}$ column of the memory array A$^{(i)}$ share a common source pillar (e.g., SP$^{(i)}_n$) and a common drain pillar (e.g., DP$^{(i)}_n$). The AND memory cells 20 in an (n+1)$^{th}$ column share a common source pillar (e.g., SP$^{(i)}_{n+1}$) and a common drain pillar (e.g., DP$^{(i)}_{n+1}$).

The common source pillar (e.g., SP$^{(i)}_n$) is coupled to a common source line (e.g., SL$_n$) and the common drain pillar (e.g., DP$^{(i)}_n$) is coupled to a common bit line (e.g., BL$_n$). The common source pillar (e.g., SP$^{(i)}_{n+1}$) is coupled to a common source line (e.g., SL$_{n+1}$) and the common drain pillar (e.g., DP$^{(i)}_{n+1}$) is coupled to a common bit line (e.g., BL$_{n+1}$).

Likewise, the block BLOCK$^{(i+1)}$ includes a memory array A$^{(i+1)}$, which is similar to the memory array A$^{(i)}$ in the block BLOCK$^{(i)}$. A row (e.g., an (m+1)$^{th}$ row) of the memory array A$^{(i+1)}$ is a set of AND memory cells 20 having a common word line (e.g., WL$^{(i+1)}_{m+1}$). The AND memory cells 20 of the memory array A$^{(i+1)}$ in each row (e.g., the (m+1)$^{th}$ row) correspond to a common word line (e.g., WL$^{(i+1)}_{m+1}$) and are coupled to different source pillars (e.g., SP$^{(i+1)}_n$ and SP$^{(i+1)}_{n+1}$) and drain pillars (e.g., DP$^{(i+1)}_n$ and DP$^{(i+1)}_{n+1}$). A column (e.g., an n$^{th}$ column) of the memory array A$^{(i+1)}$ is a set of AND memory cells 20 having a common source pillar (e.g., SP$^{(i+1)}_n$) and a common drain pillar (e.g., DP$^{(i+1)}_n$). The AND memory cells 20 of the memory array A$^{(i+1)}$ in each column (e.g., the n$^{th}$ column) correspond to different word lines (e.g., WL$^{(i+1)}_{m+1}$ and WL$^{(i+1)}_m$) and are coupled to a common source pillar (e.g., SP$^{(i+1)}_n$) and a common drain pillar (e.g., DP$^{(i+1)}_n$). Hence, the AND memory cells 20 of the memory array A$^{(i+1)}$ are logically arranged in a column along the common source pillar (e.g., SP$^{(i+1)}_n$) and the common drain pillar (e.g., DP$^{(i+1)}_n$).

The block BLOCK$^{(i+1)}$ and the block BLOCK$^{(i)}$ share source lines (e.g., SL and SL$_{n+1}$) and bit lines (e.g., BL$_n$ and BL$_{n+1}$). Therefore, the source line SL and the bit line BL are coupled to the n$^{th}$ column of AND memory cells 20 in the AND memory array A$^{(i)}$ of the block BLOCK$^{(i)}$, and are coupled to the n$^{th}$ column of AND memory cells 20 in the AND memory array A$^{(i+1)}$ of the block BLOCK$^{(i+1)}$. Similarly, the source line SL$_{n+1}$ and the bit line BL$_{n+1}$ are coupled to the (n+1)$^{th}$ column of AND memory cells 20 in the AND memory array A$^{(i)}$ of the block BLOCK$^{(i)}$, and are coupled to the (n+1)$^{th}$ column of AND memory cells 20 in the AND memory array A$^{(i+1)}$ of the block BLOCK$^{(i+1)}$.

Figure 1B:
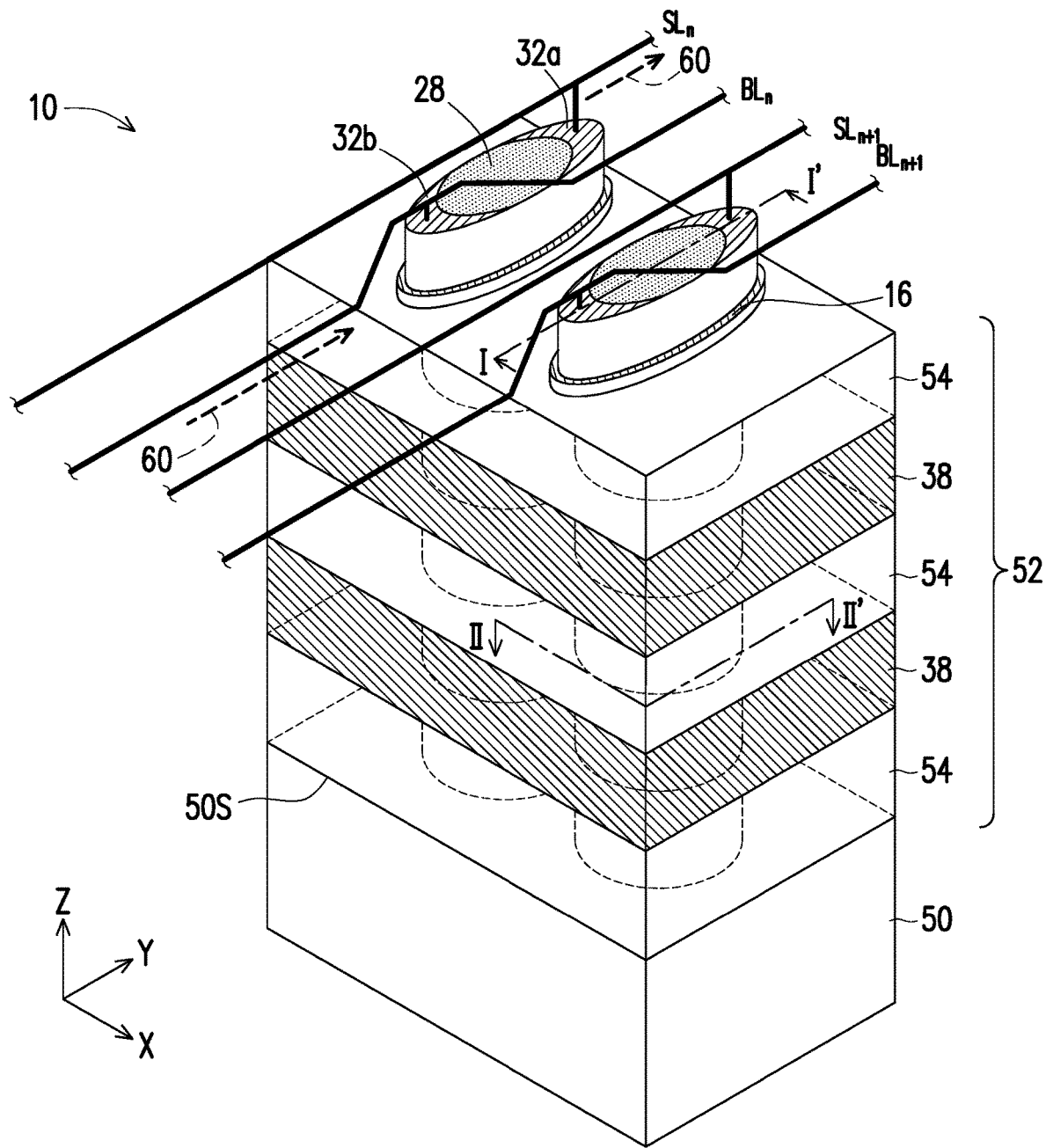
FIG. 1B is a partial perspective view of a memory array according to some embodiments of the disclosure.

Referring to FIG. 1B, the memory array 10 may be disposed over an interconnect structure of a semiconductor die, for example, being disposed on one or more active devices (e.g., transistors) formed on a semiconductor substrate. Therefore, a dielectric substrate 50 is, for example, a dielectric layer (e.g., a silicon oxide layer) over a metal interconnect structure formed on a silicon substrate. The memory array 10 may include a gate stack structure 52, a plurality of channel pillars 16, a plurality of first conductive pillars (also referred to as source pillars) 32a, a plurality of second conductive pillars (also referred to as drain pillars) 32b, and a plurality of charge storage structures 40.

Referring to FIG. 1B, the gate stack structure 52 is formed on the dielectric substrate 50 in an array region (not shown) and a staircase region (not shown). The gate stack structure 52 includes a plurality of gate layers (also referred to as word lines) 38 and a plurality of insulating layer 54 vertically stacked on a surface 50s of the dielectric substrate 50. In the Z direction, the gate layers 38 are electrically isolated from each other by the insulating layer 54 disposed therebetween. The gate layer 38 extends in a direction parallel to the surface of the dielectric substrate 50. As shown in FIG. 1B, the gate layers 38 in the staircase region may have a staircase structure (not shown). Therefore, a lower gate layer 38 is longer than an upper gate layer 38, and the end of the lower gate layer 38 extends laterally beyond the end of the upper gate layer 38. A contact (not shown) for connecting the gate layer 38 may land on the end of the gate layer 38 to connect the gate layers 38 respectively to conductive lines.

Referring to FIG. 1B to FIG. 1G, the memory array 10 further includes a plurality of channel pillars 16. The channel pillar 16 continuously extends through the gate stack structure 52. The material of the channel pillar 16 may be semiconductor such as undoped polysilicon.

Referring to FIG. 1B to FIG. 1G, the memory array 10 further includes an insulating pillar 28, a plurality of first conductive pillars 32a, and a plurality of second conductive pillars 32b. In this example, the first conductive pillars 32a serve as source pillars. The second conductive pillars 32b serve as drain pillars. The first conductive pillar 32a, the second conductive pillar 32b, and the insulating pillar 28 each extend in a direction (i.e., the Z direction) perpendicular to the gate layer 38. The first conductive pillar 32a and the second conductive pillar 32b are separated from each other by the insulating pillar 28. The first conductive pillar 32a and the second conductive pillar 32b are electrically connected to the channel pillar 16. The first conductive pillar 32a and the second conductive pillar 32b include doped polysilicon or metal materials. The insulating pillar 28 is, for example, silicon nitride or silicon oxide.

Figure 1C:
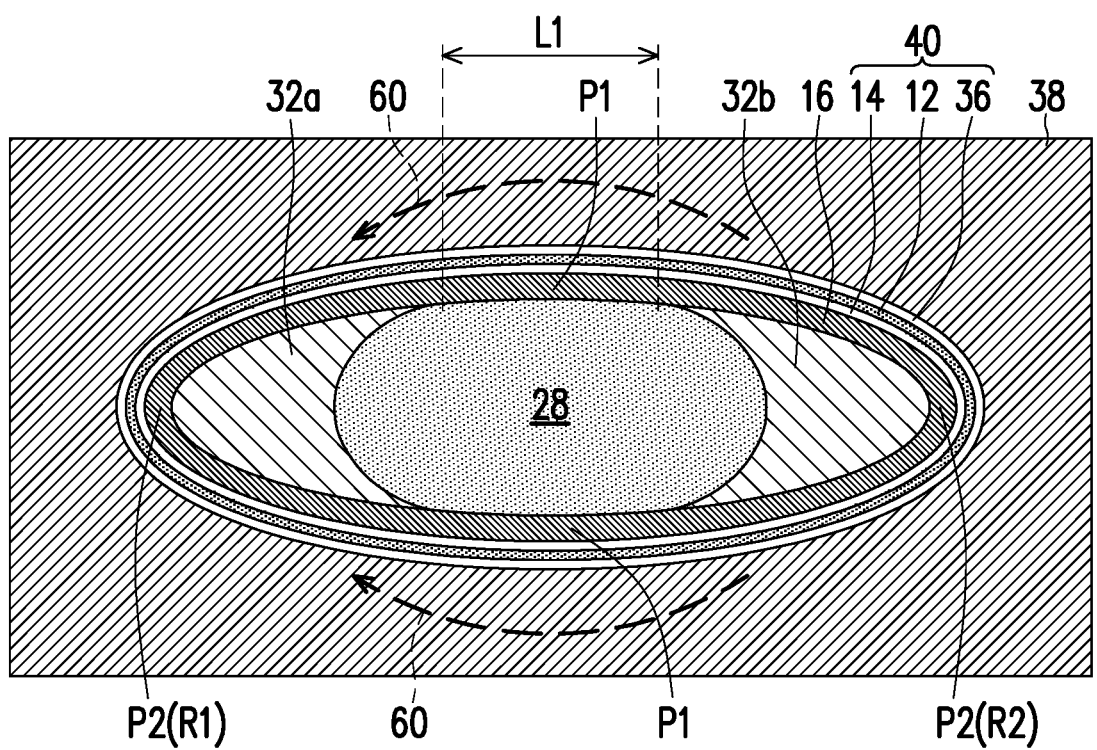
FIG. 1C is a schematic cross-sectional view taken along line II-II' in FIG. 1B.
Figure 1D:
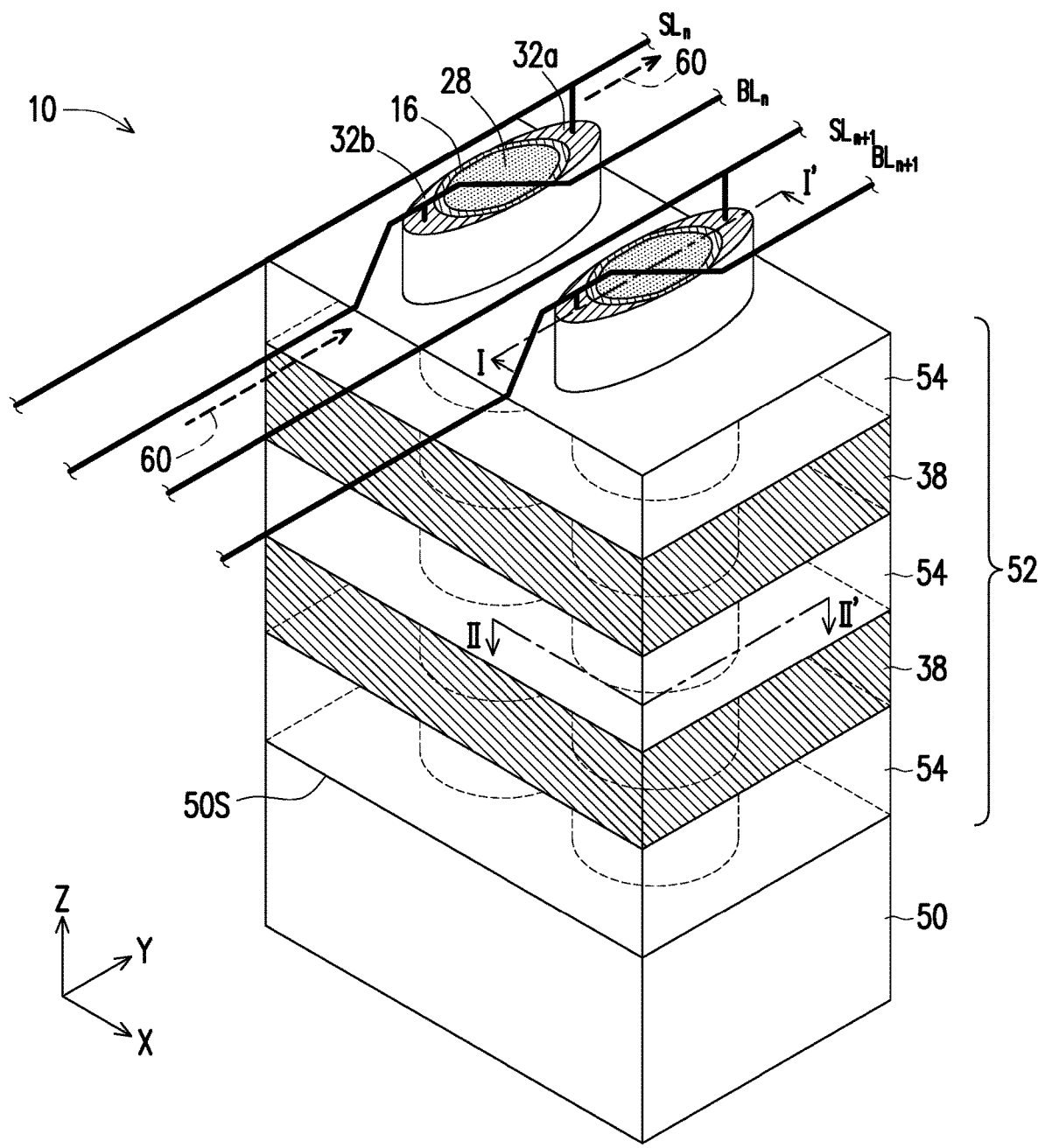
FIG. 1D is a partial perspective view of a memory array according to other embodiments of the disclosure.
Figure 1E:
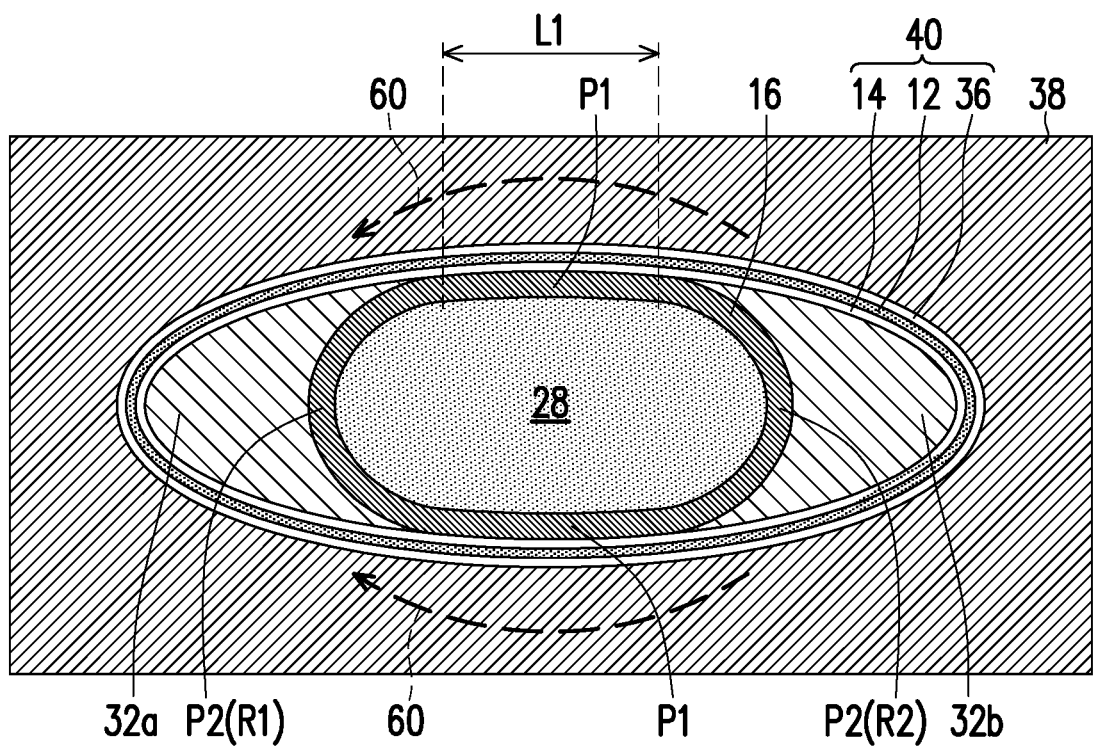
FIG. 1E is a schematic cross-sectional view taken along line III-III' in FIG. 1D.
Figure 1F:
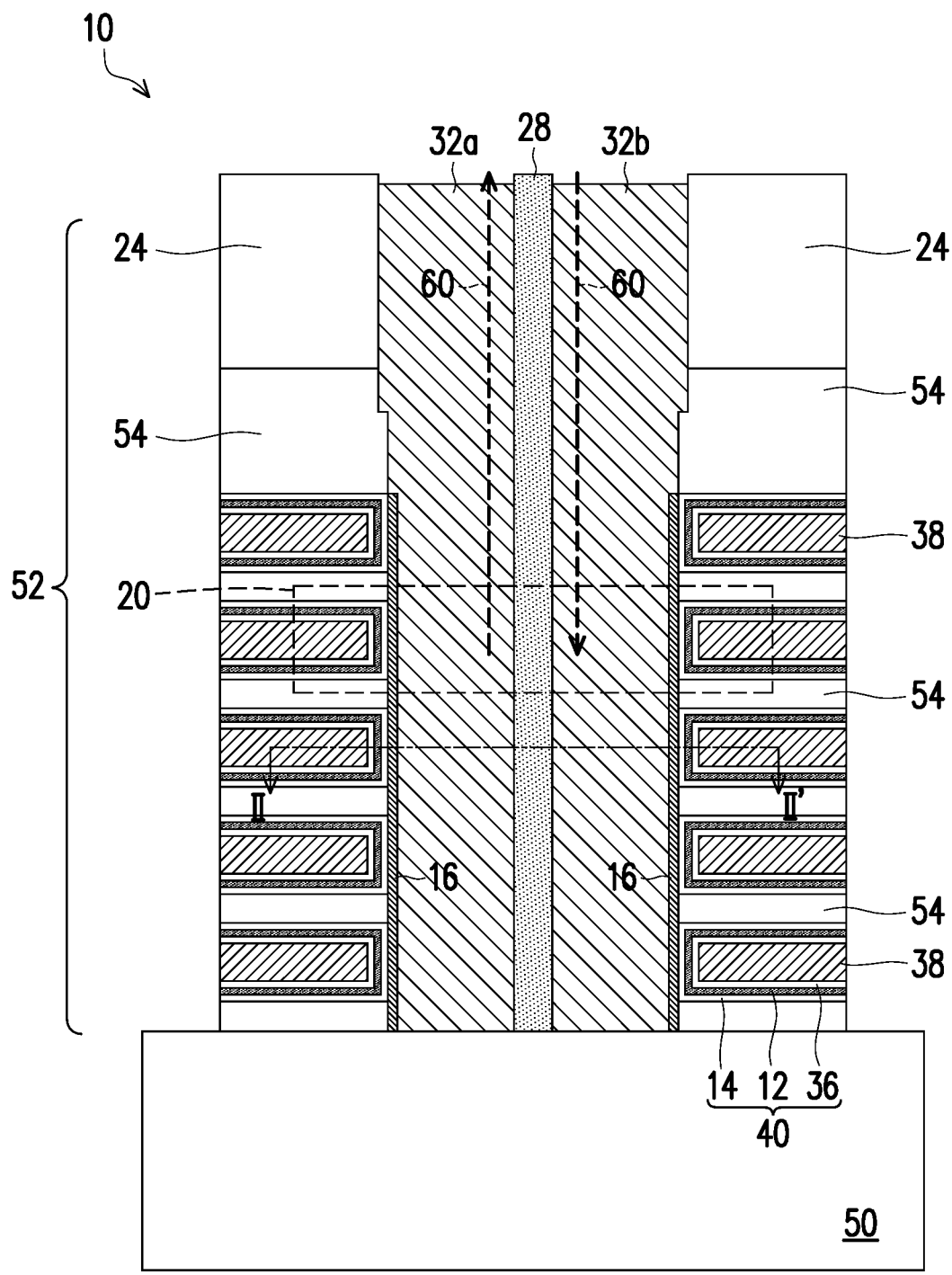
FIG. 1F is a schematic cross-sectional view taken along line I-I' in FIG. 1B or FIG. 1D.
Figure 1G:
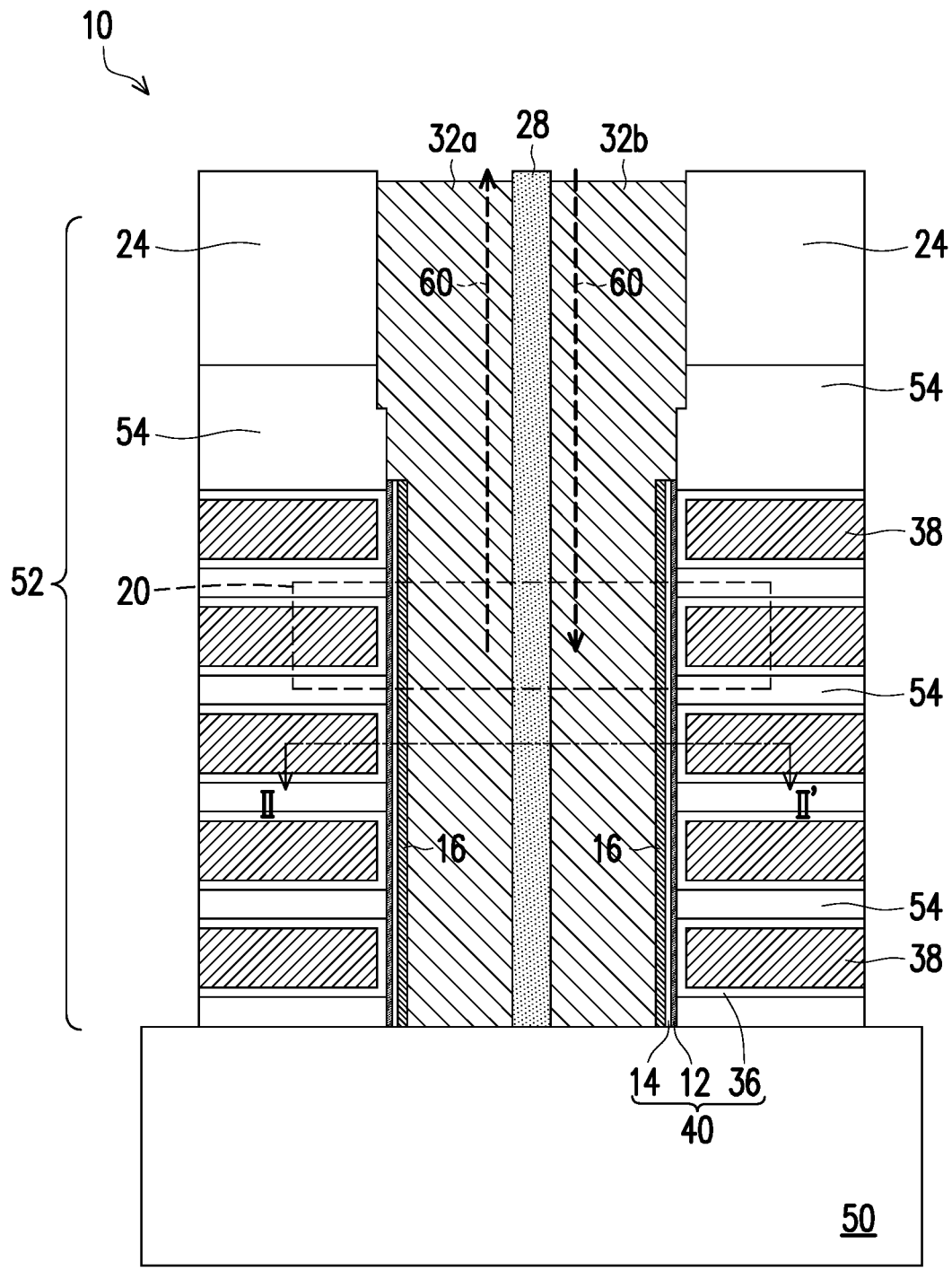
FIG. 1G is a schematic cross-sectional view taken along line I-I' in FIG. 1B or FIG. 1D.

Referring to FIG. 1C, FIG. 1E, FIG. 1F and FIG. 1G, the charge storage structure 40 encloses the channel pillar 16, the first conductive pillar 32a, the second conductive pillar 32b and the insulating pillar 28. At least a portion of the charge storage structure 40 is disposed between the channel pillar 16 and the gate layers 38. The charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14 and the blocking layer 36 include silicon oxide. The charge storage layer 12 includes silicon nitride or other materials capable of trapping charges. In some embodiments, as shown in FIG. 1F, the charge storage structure 40 (the tunneling layer 14, the charge storage layer 12, and the blocking layer 36) surrounds the gate layer 38. In other embodiments, as shown in FIG. 1G, a portion (the tunneling layer 14 and the charge storage layer 12) of the charge storage structure 40 continuously extends in a direction (i.e., the Z direction) perpendicular to the gate layer 38, and the other portion (the blocking layer 36) of the charge storage structure 40 surrounds the gate layer 38.

Referring to FIG. 1F, the charge storage structure 40, the channel pillar 16, the source pillar 32a, and the drain pillar 32b are surrounded by the gate layer 38 and a memory cell 20 is defined. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

During operation, a voltage is applied to a selected word line (gate layer) 38; for example, when a voltage higher than a corresponding threshold voltage ($V_{th}$) of the corresponding memory cell 20 is applied, a channel region of the channel pillar 16 intersecting the selected word line 38 is turned on to allow a current to enter the drain pillar 32b from the bit line $BL_n$ or $BL_{n+1}$ (shown in FIG. 1B and FIG. 1D), flow to the source pillar 32a via the turned-on channel region (e.g., in a direction indicated by arrow 60), and finally flow to the source line $SL_n$ or $SL_{n+1}$ (shown in FIG. 1B and FIG. 1D).

However, if the channel pillar 16 has a circular ring shape, a large electric field will be generated due to an overly large curvature, which will cause memory read disturb. In the embodiment of the disclosure, in a top view, i.e., in a projection on the surface 50s of the dielectric substrate 50, the channel pillar 16 has an elongated profile such as a ring-shaped ellipse, and the charge storage structure 40 and the insulating pillar 28 may respectively be elliptical. The first conductive pillar 32a and the second conductive pillar 32b, which serves as the source pillar and drain pillar, are disposed on a long axis of the elliptical profile to increase the path therebetween, so that the effect of the electric field and memory read disturb can reduced.

Referring to FIG. 1C and FIG. 1E, the channel pillar 16 of the embodiment of the disclosure includes a first part P1 and a second part P2. A projection of the first part P1 and the second part P2 are connected each other and a projection of a combination of the first part P1 and the second part P2 on the surface of the dielectric substrate 50 has an elliptical profile. The first part P1 is located between the charge storage layer 12 and the insulating pillar 28 to serve as the channel region. A length L1 of the first part P1 is the length of the channel. A first region R1 of the second part P2 is in contact with and electrically connected to the first conductive pillar 32a, and a second region R2 of the second part P2 is in contact with and electrically connected to the second conductive pillar 32b. The curvature of the first part P1 of channel pillar 16 is smaller than the curvature of the second part P2.

Referring to FIG. 1C, in some embodiments, the first part P1 and the second part P2 of the channel pillar 16 are in contact with the inner sidewall of the charge storage structure 40. The first part P1 and the second part P2 of the channel pillar 16 are both disposed between and in contact with the insulating pillar 28 and the charge storage structure 40. The first conductive pillar 32a and the second conductive pillar 32b are located between the insulating pillar 28 and the second part P2 of the channel pillar 16 and fill up the space between the insulating pillar 28 and the second part P2 of the channel pillar 16. The first conductive pillar 32a and the second conductive pillar 32b respectively have a recess shape with openings opposite to each other.

Referring to FIG. 1D and FIG. 1E, in other embodiments, an inner sidewall of the channel pillar 16 is conformal with the outer sidewall of the insulating pillar 28. The first part P1 of the channel pillar 16 is disposed between and in contact with the insulating pillar 28 and the charge storage structure 40. The second part P2 of the channel pillar 16 is disposed between and in contact with the first conductive pillar 32a and the insulating pillar 28, and is disposed between and in contact with the second conductive pillar 32b and the insulating pillar 28. The first conductive pillar 32a and the second conductive pillar 32b are located between the second part P2 of the channel pillar 16 and the charge storage structure 40 and fill up the space between the second part P2 of the channel pillar 16 and the charge storage structure 40. The first conductive pillar 32a and the second conductive pillar 32b respectively have a recess shape with openings opposite to each other.

Since the first part P1 of the channel pillar 16 that serves as the channel region has a smaller curvature, it is possible to reduce the effect of the electric field and reduce the disturbance to the current in its traveling direction. Therefore, it is possible to improve the accuracy of memory reading.

FIG. 2A to FIG. 2I are schematic top views of a process of fabricating a 3D AND flash memory device according to an embodiment of the disclosure. FIG. 3A to FIG. 3I are schematic cross-sectional view taken along line IV-IV' in FIG. 2A to FIG. 2I.

Figure 2A:
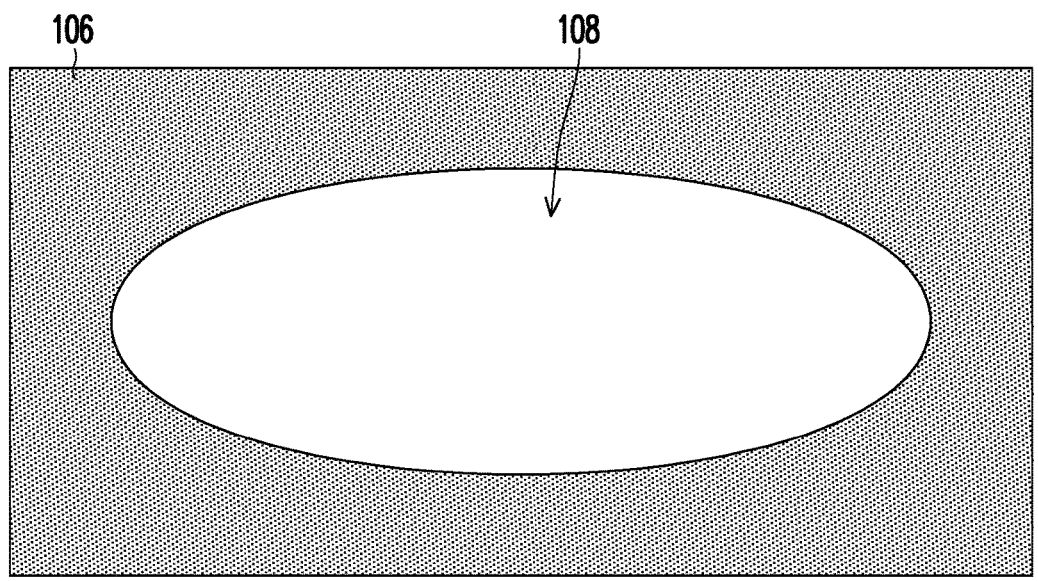
FIG. 2A to FIG. 2I are schematic top views of a process of fabricating a 3D AND flash memory device according to an embodiment of the disclosure.
Figure 3A:
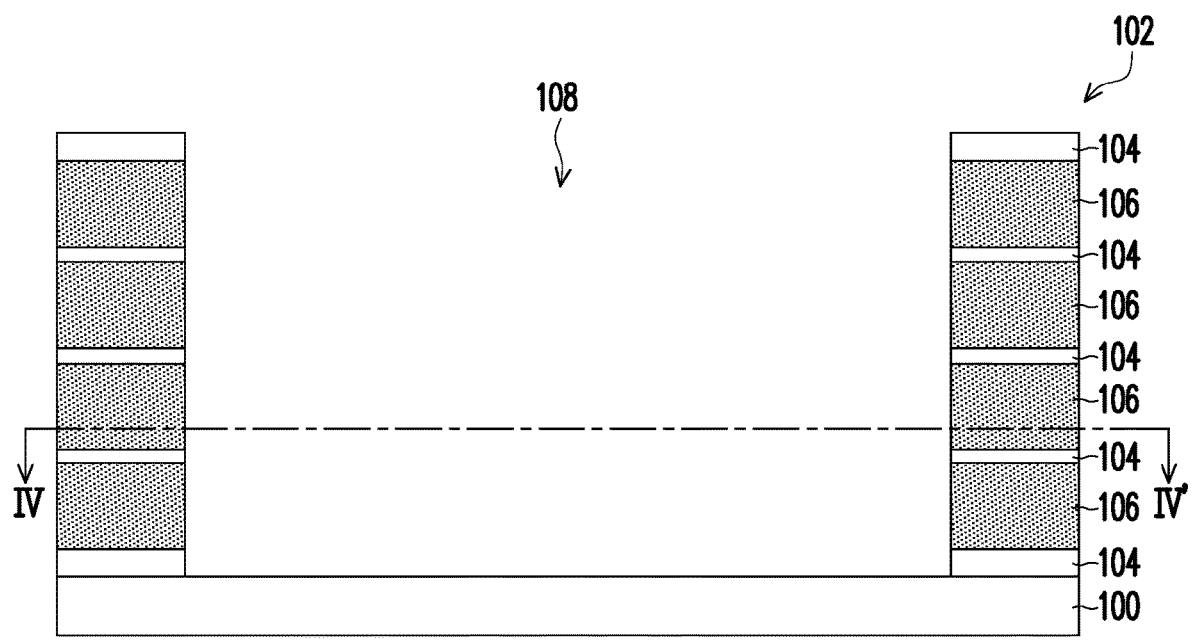
FIG. 3A to FIG. 3I are schematic cross-sectional view taken along line IV-IV' in FIG. 2A to FIG. 2I.

Referring to FIG. 2A and FIG. 3A, a stack structure 102 is formed on a dielectric substrate 100. The dielectric substrate 100 is, for example, a dielectric layer (e.g., a silicon oxide layer) over a metal interconnect structure formed on a silicon substrate. The stack structure 102 may be composed of sacrificial layers 106 and insulating layers 104 that are sequentially alternately stacked on the dielectric substrate 100. The uppermost layer of the stack structure 102 may be the insulating layer 104. The lowermost layer of the stack structure 102 may be the sacrificial layer 106 or the insulating layer 104. The insulating layer 104 is, for example, a silicon oxide layer. The sacrificial layer 106 is, for example, a silicon nitride layer. In this embodiment, the stack structure 102 has five insulating layers 104 and four sacrificial layers 106, but the disclosure is not limited thereto. In other embodiments, more insulating layers 104 and more sacrificial layers 106 may be formed according to the actual requirements.

Photolithography and etching processes are performed to form a plurality of openings 108 in the stack structure 102. However, for simplicity, only one opening 108 is shown in figures. In this embodiment, the bottom surface of the opening 108 exposes the dielectric substrate 100, but the disclosure is not limited thereto. In other embodiments, when the lowermost layer of the stack structure 102 is the insulating layer 104, the bottom of the opening 108 may be located in the lowermost insulating layer 104. Namely, the bottom surface of the opening 108 may expose the lowermost insulating layer 104 without exposing the dielectric substrate 100. Alternatively, in other embodiments, the bottom of the opening 108 may further extend into the dielectric substrate 100.

In this embodiment, in a top view, the opening 108 has an elongated profile. For example, the opening 108 has an elliptical profile with a long axis and a short axis, but the disclosure is not limited thereto. In other embodiments, the opening 108 may have a profile of other shapes such as a polygonal shape (not shown).

Figure 2B:
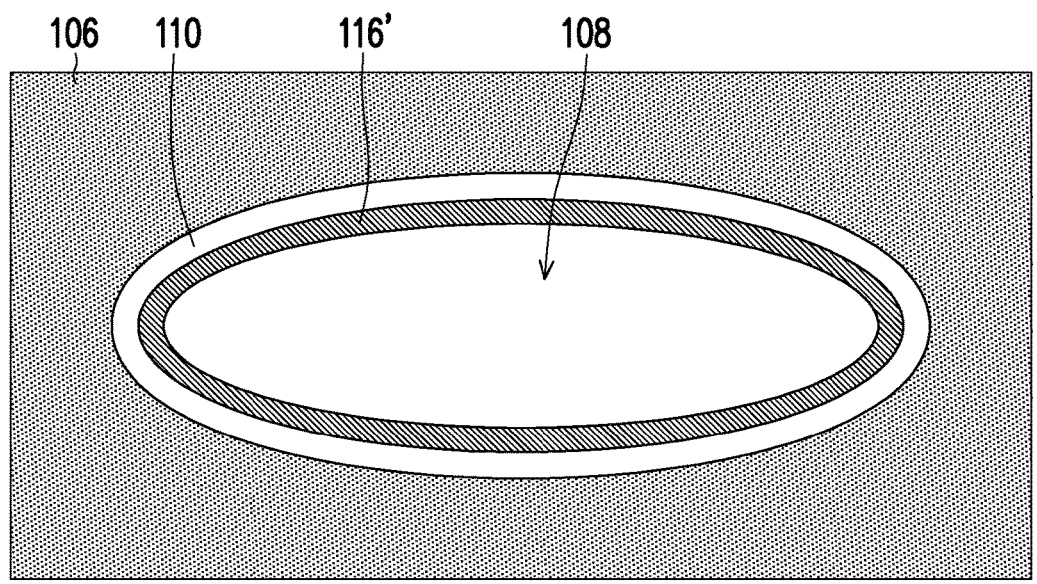
Figure 3B:
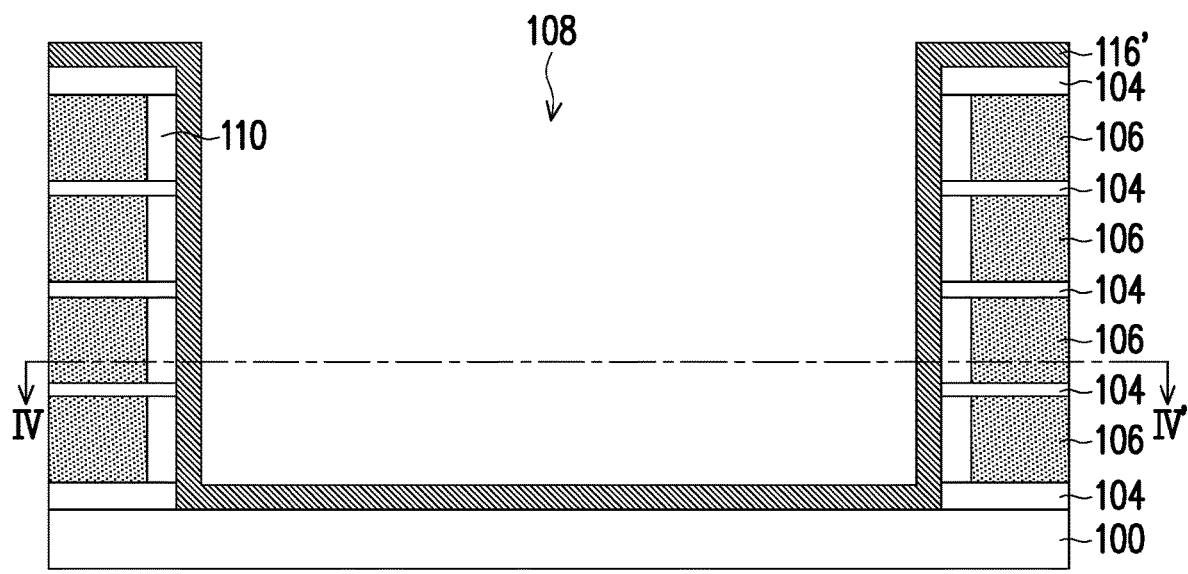

Referring to FIG. 2B and FIG. 3B, a thermal oxidation process is performed to oxidize the surface of the sidewall of the sacrificial layer 106 exposed by the opening 108 to form a protection layer 110. Next, a channel material 116' is formed on the stack structure 102 and in the opening 108. The material of the channel material 116' may be a semiconductor material such as undoped polysilicon.

Figure 2C:
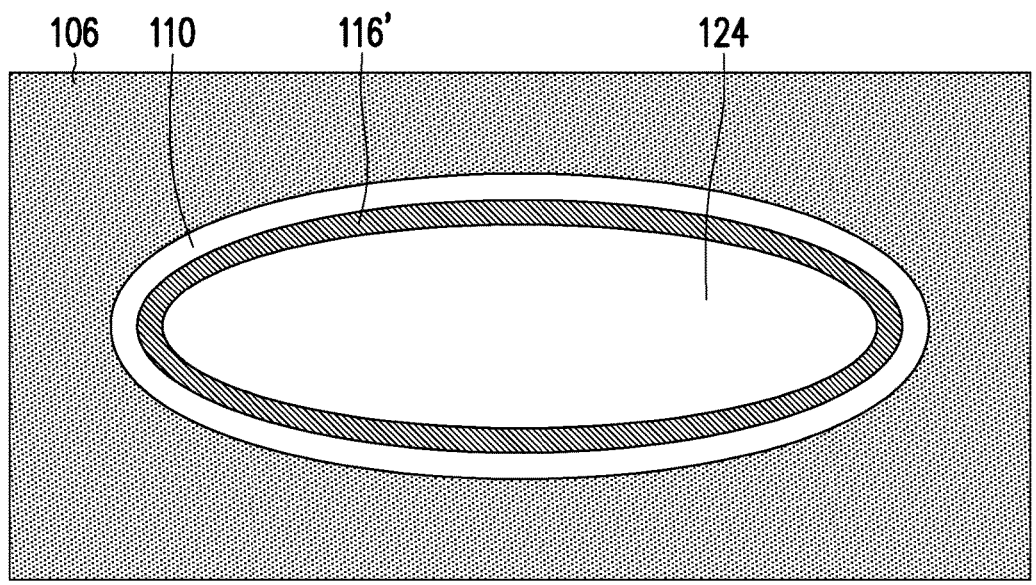
Figure 3C:
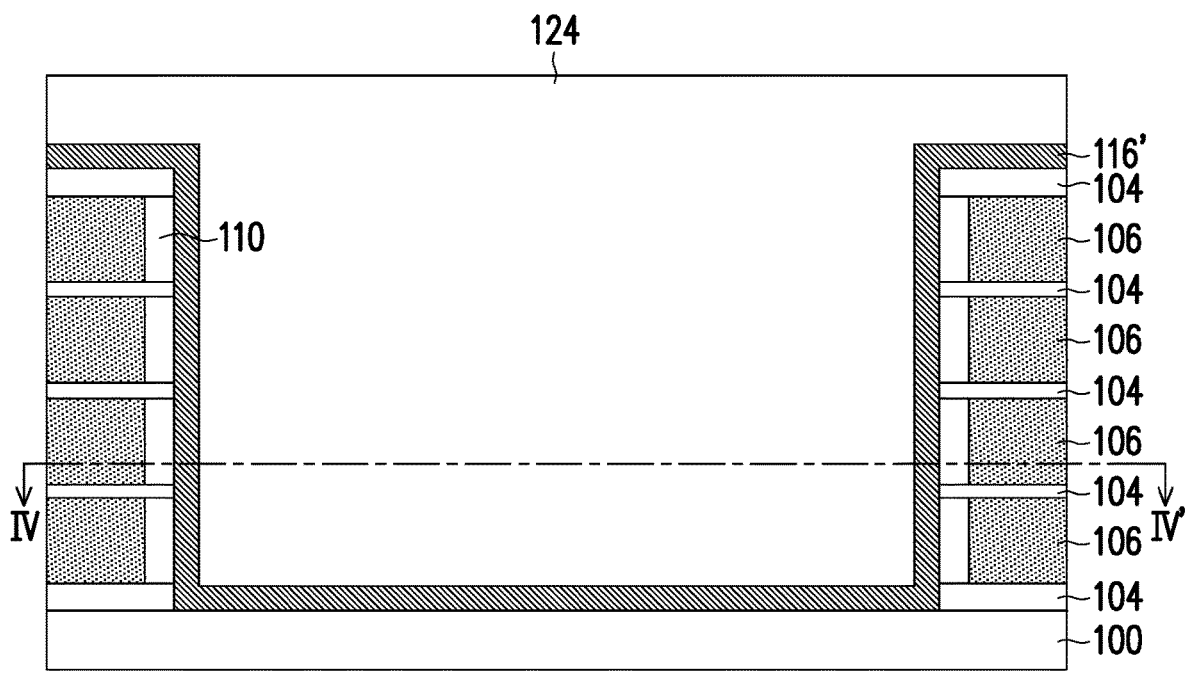

Referring to FIG. 2C and FIG. 3C, next, the opening 108 is filled with a filling layer. In some embodiments, the filling layer is an insulating material (i.e., an insulating filling layer 124). The insulating filling layer 124 is covered on the channel material 116'. The material of the insulating filling layer 124 is, for example, silicon oxide.

Figure 2D:
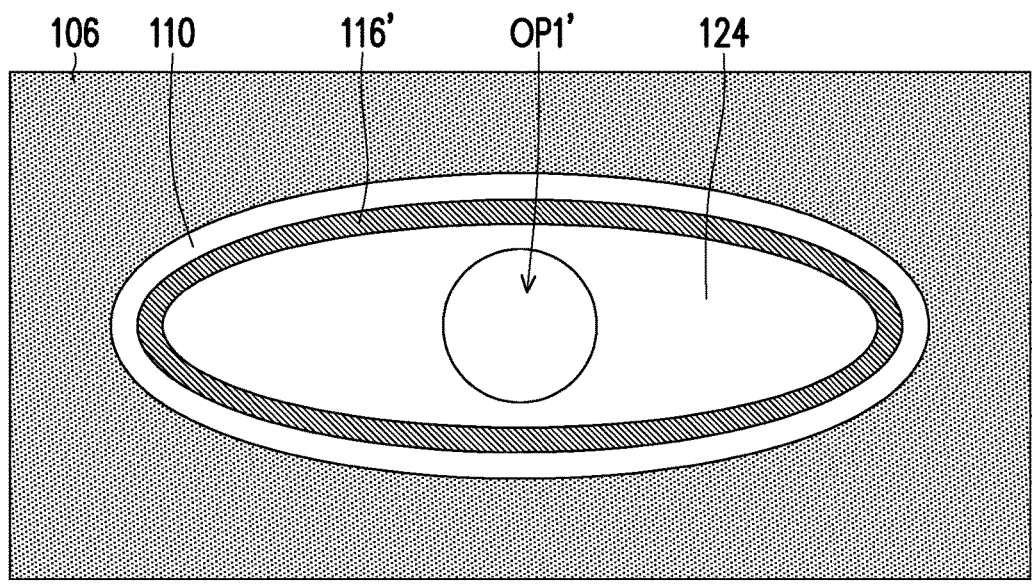
Figure 3D:
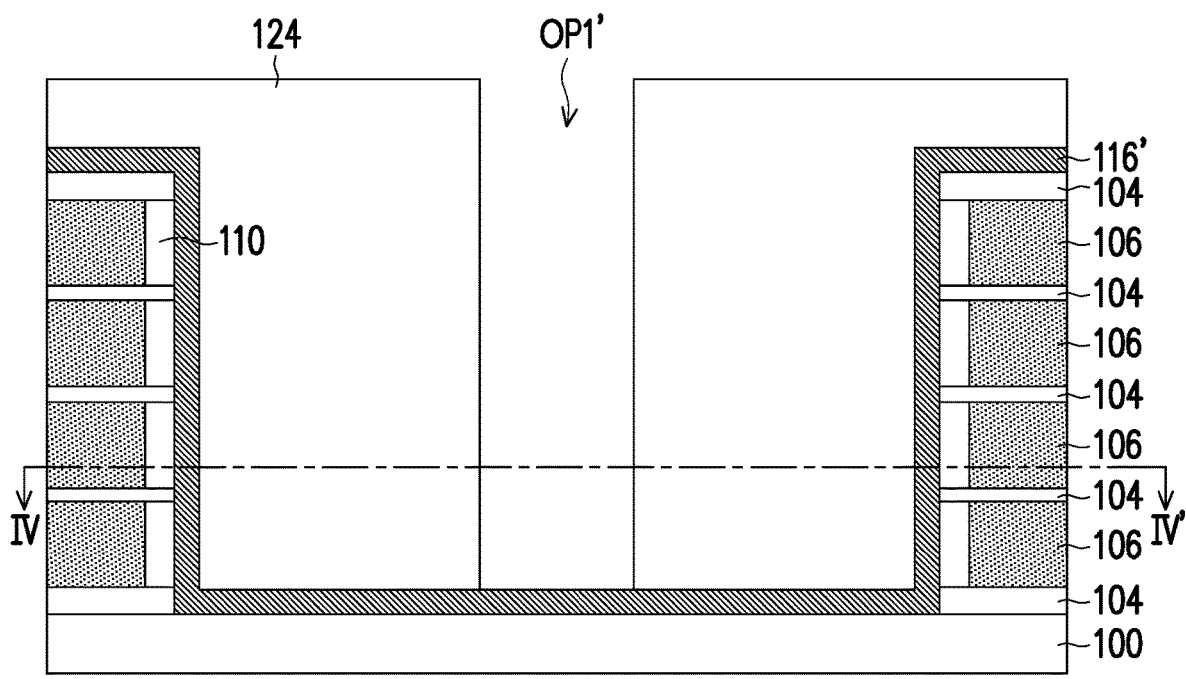

Referring to FIG. 2D and FIG. 3D, an opening OP1' is formed in the central region of the insulating filling layer 124 through photolithography and etching processes. The opening OP1' has a circular shape, for example. The etching process is, for example, an anisotropic etching process such as a dry etching process.

Figure 2E:
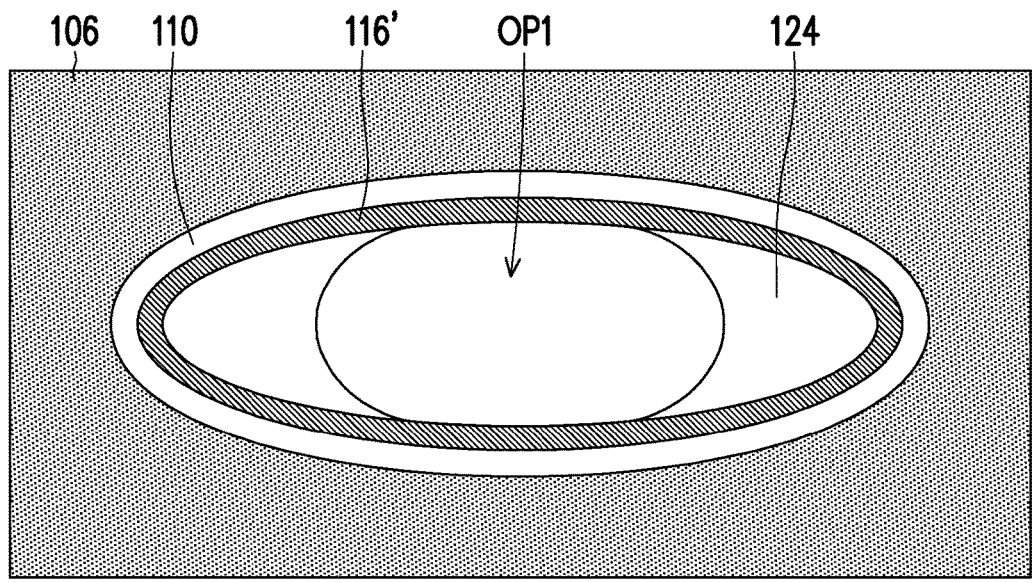
Figure 3E:
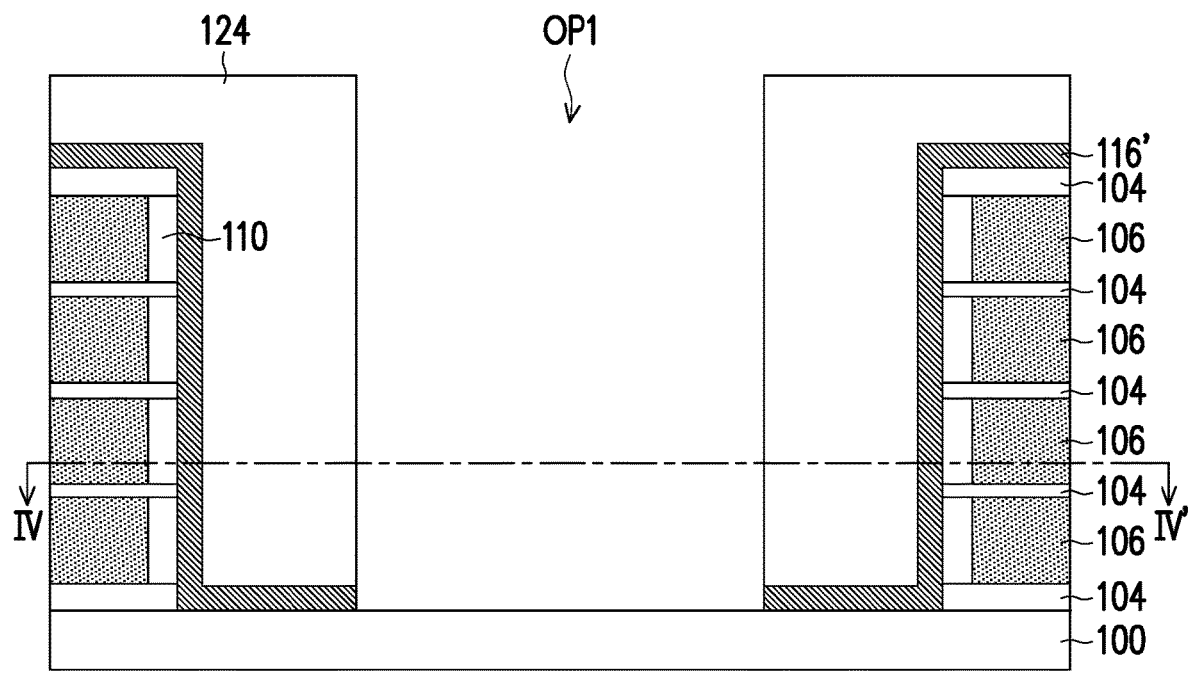

Referring to FIG. 2E and FIG. 3E, a pull-back process is performed to remove a portion of the insulating filling layer 124 around the opening OP1', so that the opening OP1' is flared to form an opening OP1. The pull-back process may be an isotropic etching process such as a wet etching process. In an embodiment in which the insulating filling layer 124 is silicon oxide, the etching process may be a wet etching process using, for example, a hydrofluoric acid solution as the etchant. In contrast to the above dry etching process for forming the opening OP1', a wet etching process is adopted for forming the opening OP1, so that a higher etch selectivity between the insulating filling layer 124 and the channel material 116' can be obtained. Therefore, during the pull-back process, in the short-axis direction of the opening 108, the channel material 116' may serve as a stop layer; in the long-axis direction of the opening 108, the insulating filling layer 124 may be continuously etched. Therefore, the opening OP1 has an elongated profile. The opening OP1 has, for example, an elliptical profile with a long axis and a short axis, but the disclosure is not limited thereto. In other embodiments, the opening OP1 may have a profile of other shapes such as a polygonal shape (not shown). Afterwards, the channel material 116' below the opening OP1 is removed. The sidewall of the opening OP1 in the short-axis direction exposes the channel material 116'; the sidewall of the opening OP1 in the long-axis direction exposes the insulating filling layer 124. With the high etch selectivity between the insulating filling layer 124 and the channel material 116', after the pull-back process, the channel material 116' (which will serve as the channel region) is hardly damaged.

Figure 2F:
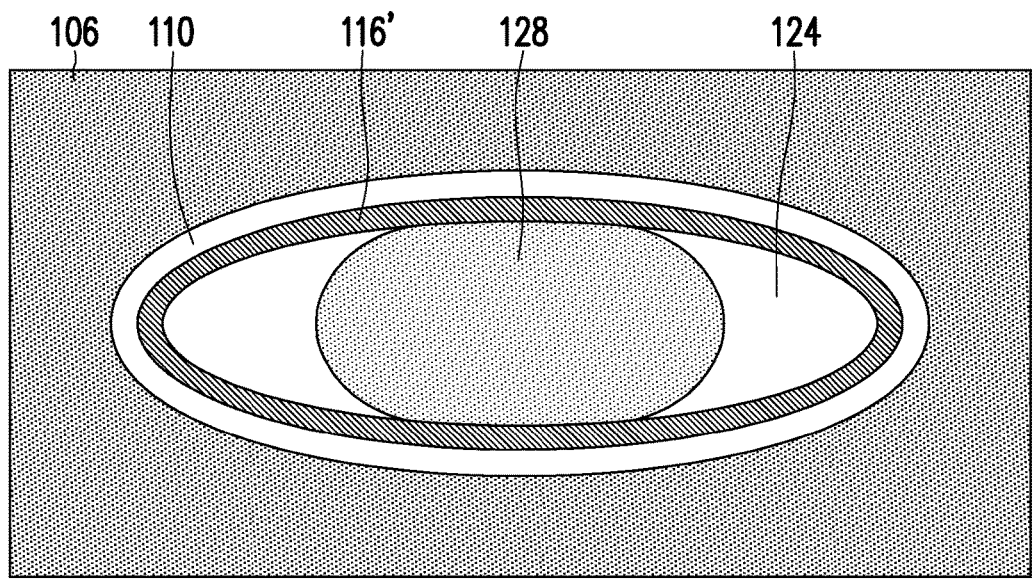
Figure 3F:
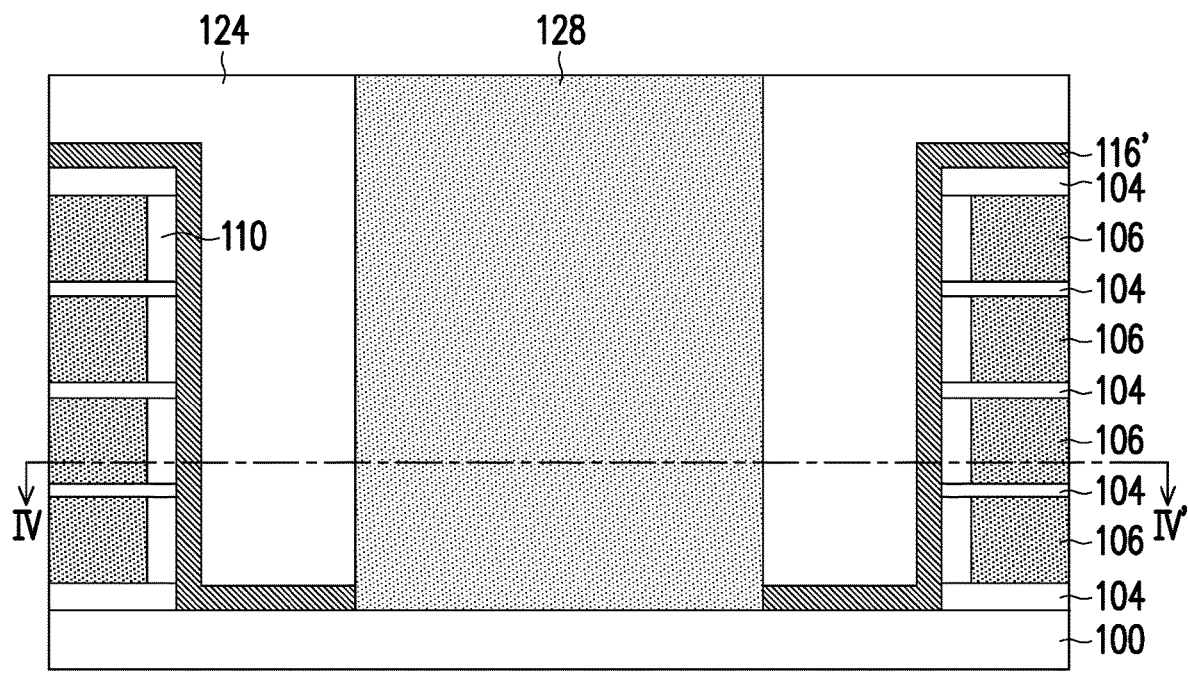

Referring to FIG. 2F and FIG. 3F, next, an insulating material (e.g., silicon nitride) different from the material of the insulating filling layer 124 is filled in the opening OP1 to completely seal the opening OP1. After the insulating material is etched back through a dry etching or wet etching process until the surface of the insulating filling layer 124 is exposed, the insulating material remaining in the opening OP1 forms an insulating pillar 128.

Figure 2G:
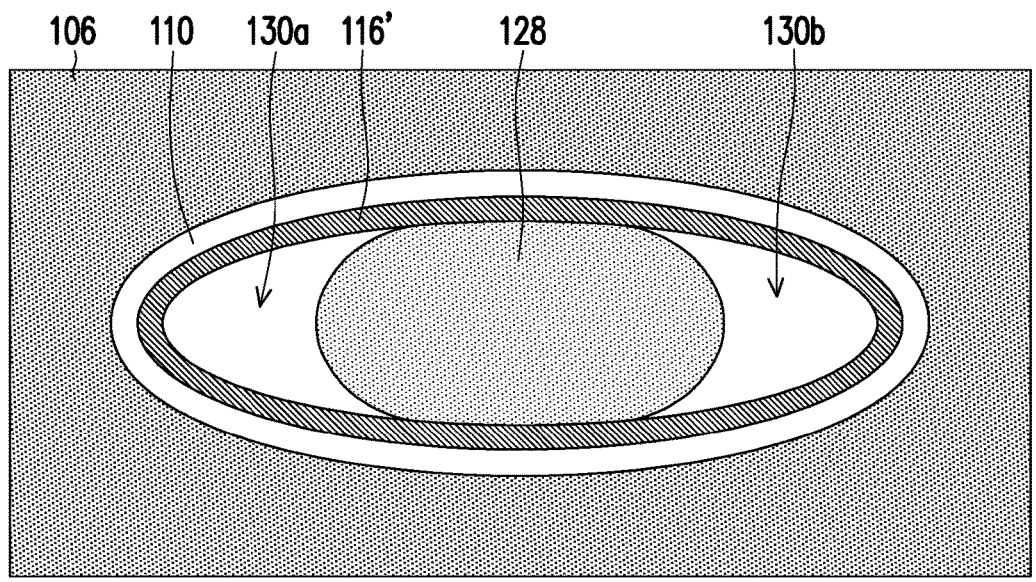
Figure 3G:
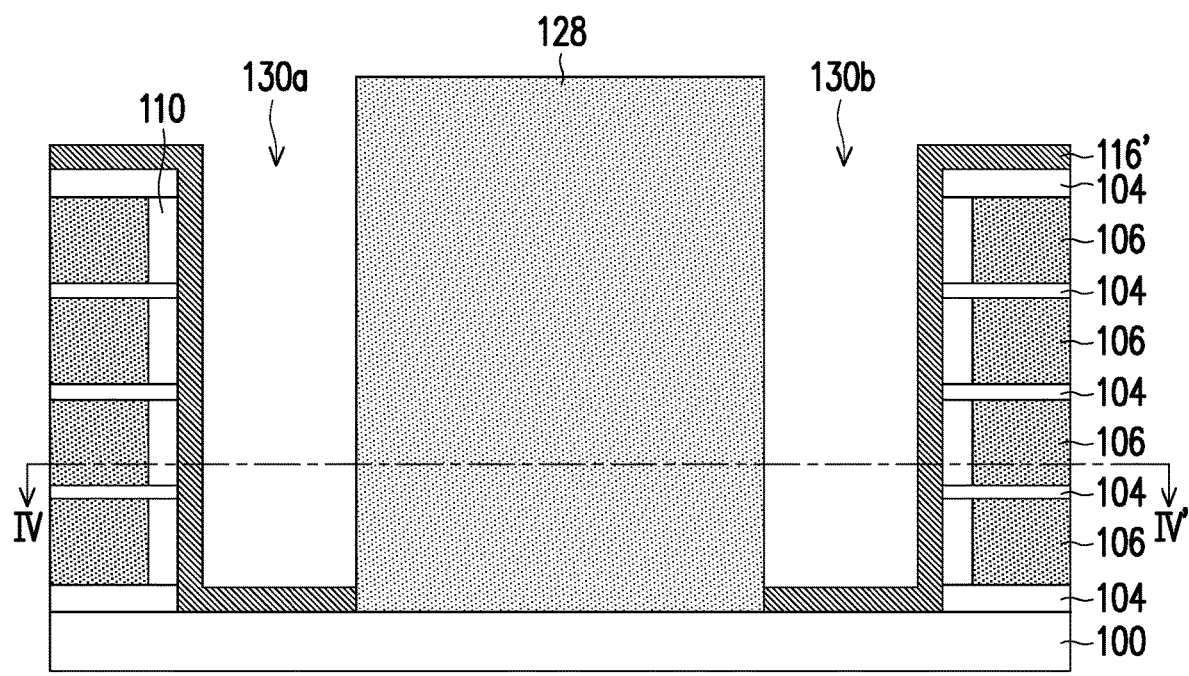

Referring to FIG. 2G and FIG. 3G, an etching process is performed to remove the insulating filling layer 124 and form holes 130a and 130b on two sides of the insulating pillar 128. That is the opening OP1 is divided into two compartments (i.e., holes 130a and 130b) by the insulating pillar 128. In an embodiment in which the insulating filling layer 124 is silicon oxide, the etching process may be a wet etching process using, for example, a hydrofluoric acid solution as the etchant. The sidewalls of the holes 130a and 130b expose the channel material 116' and the insulating pillar 128. The bottoms of the holes 130a and 130b expose the channel material 116'. Since the etching rate of the insulating pillar 128 is lower than the etching rate of the insulating filling layer 124, the insulating pillar 128 is hardly damaged by etching and remains.

Figure 2H:
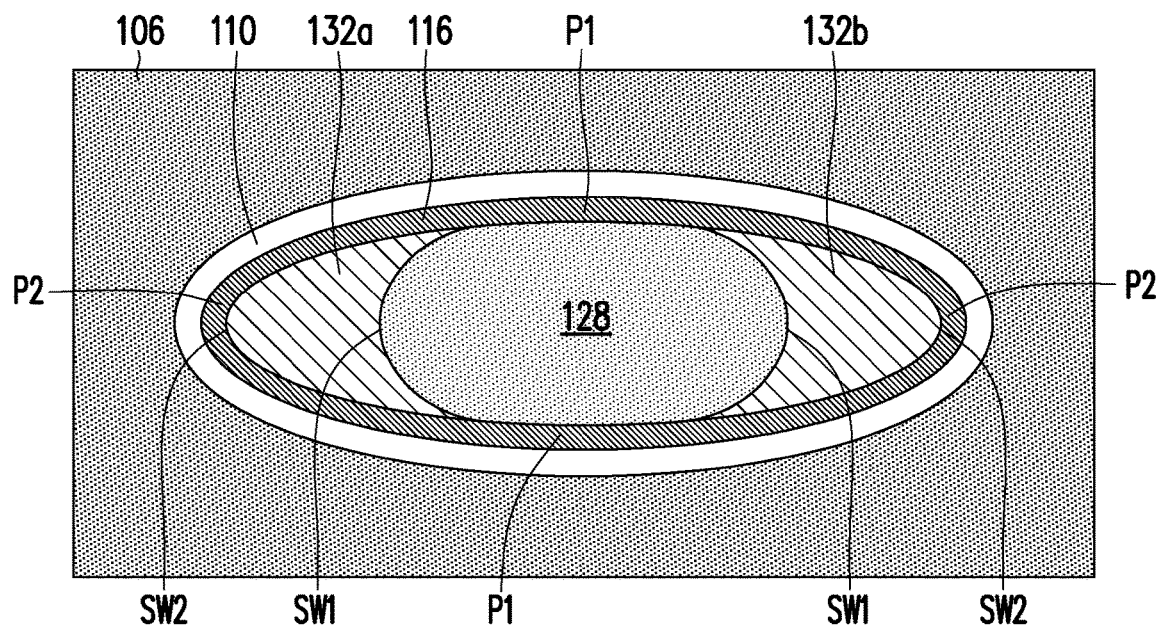
Figure 3H:
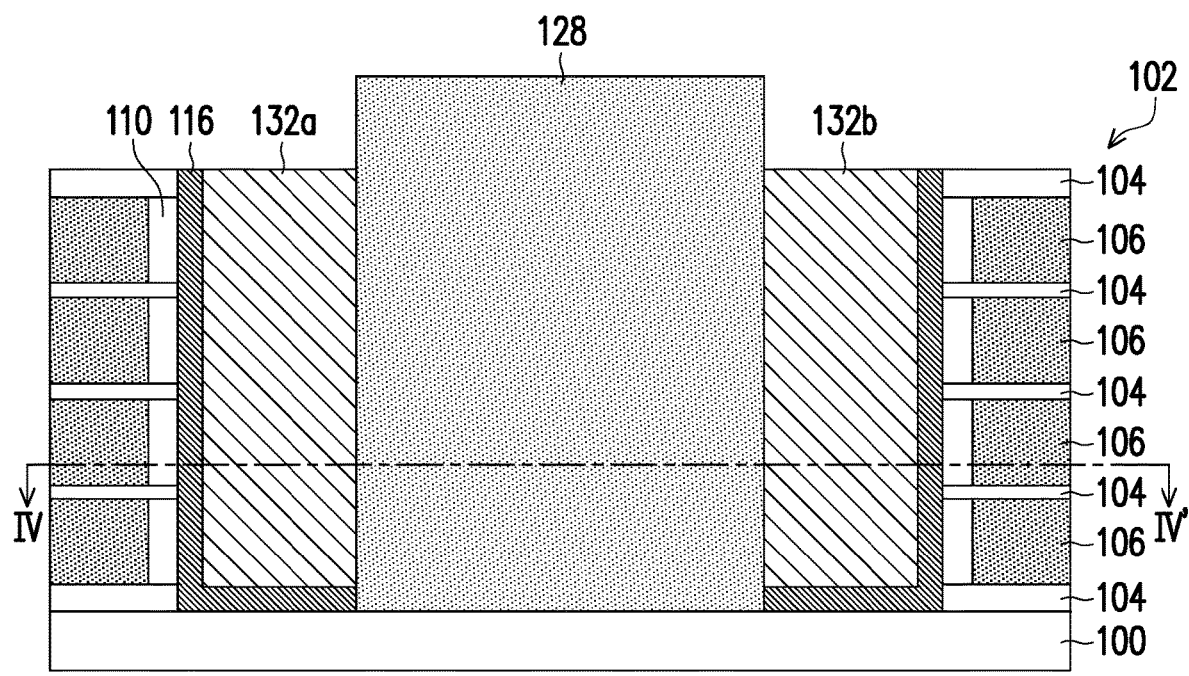

Referring to FIG. 2H and FIG. 3H, a conductive layer is formed on the channel material 116' and the insulating pillar 128 and in the holes 130a and 130b. The conductive layer is, for example, doped polysilicon. The dopant in the doped polysilicon is, for example, N-type such as phosphorus or arsenic. The dopant in the doped polysilicon is, for example, P-type such as boron or boron trifluoride. Afterwards, the conductive layer and the channel material 116' are etched back through a dry etching or wet etching process until the surface of the stack structure 102 is exposed to form conductive pillars 132a and 132b and a channel pillar 116. The conductive pillars 132a and 132b may respectively serve as a source pillar and a drain pillar. One sidewall SW1 of the conductive pillars 132a or 132b is in contact with the insulating pillar 128, and another sidewall SW2 of the conductive pillars 132a or 132b is respectively electrically connected to the channel pillar 116. The first conductive pillars 132a and the second conductive pillars 132b occupy the volume of the space between the insulating pillar 128 and the second portion P2 of the channel pillar 116. Therefore, the volumes of the first conductive pillar 132a and the conductive pillar 132b are substantially the same as the volumes of the spaces between the insulating pillar 128 and the second portion P2 of the channel pillar 116.

Figure 2I:
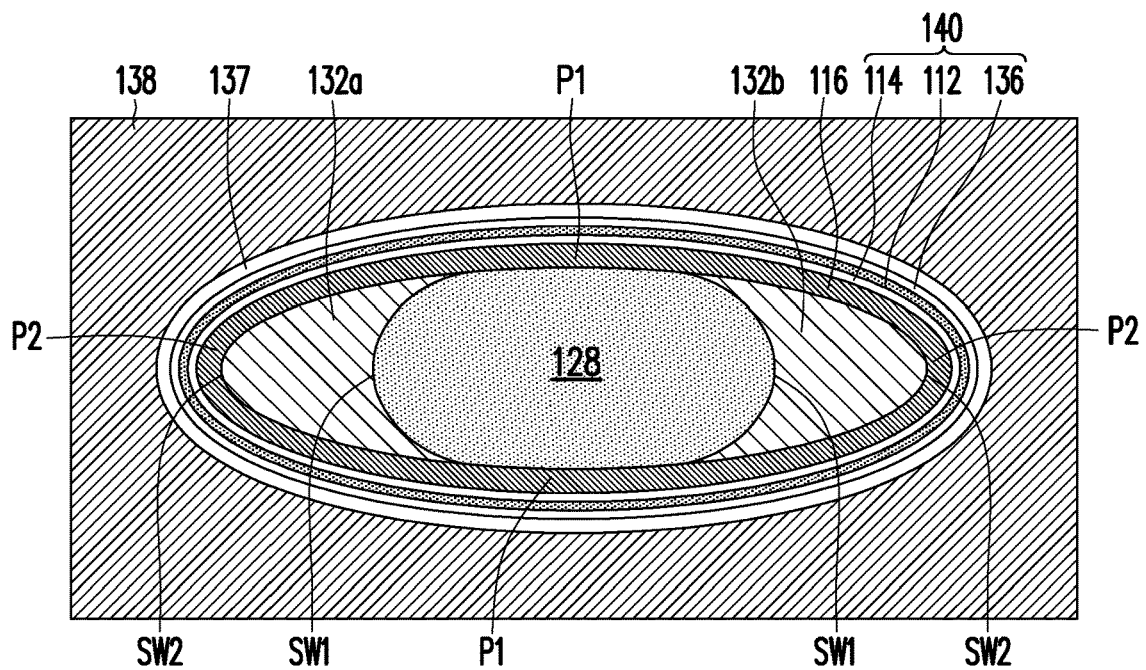
Figure 3I:
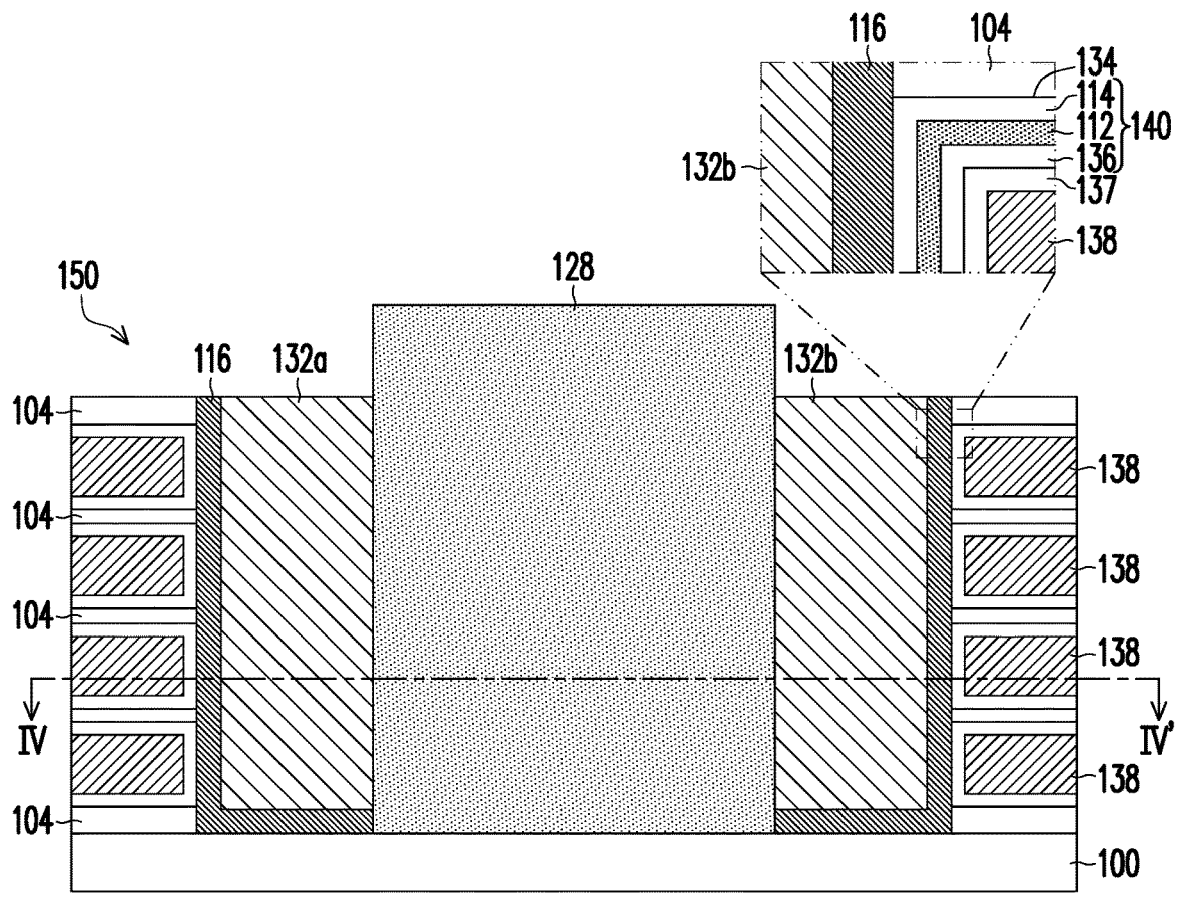
Figure 4A:
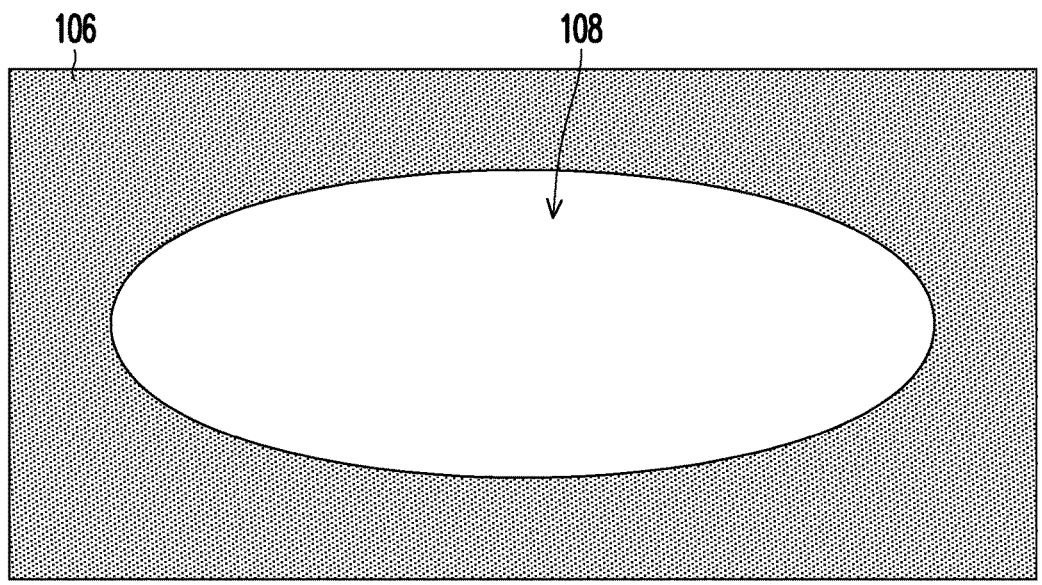
FIG. 4A to FIG. 4I are schematic top views of a process of fabricating a 3D AND flash memory device according to an embodiment of the disclosure.
Figure 5A:
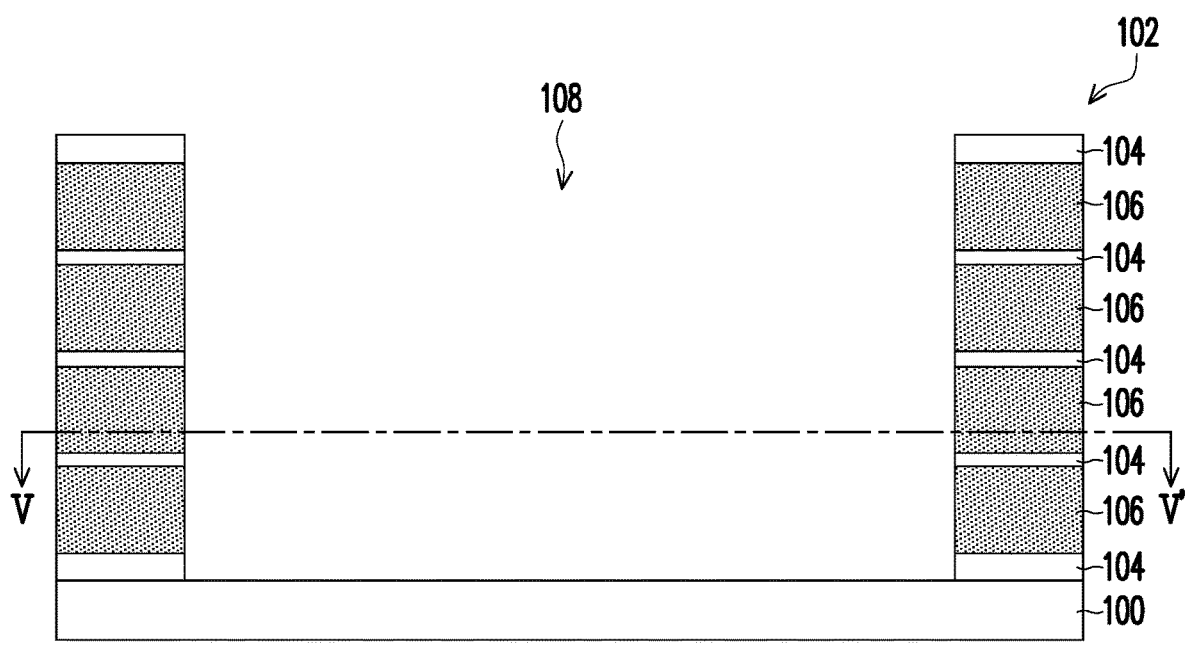
FIG. 5A to FIG. 5I are schematic cross-sectional view taken along line V-V' in FIG. 4A to FIG. 4I.
Figure 4B:
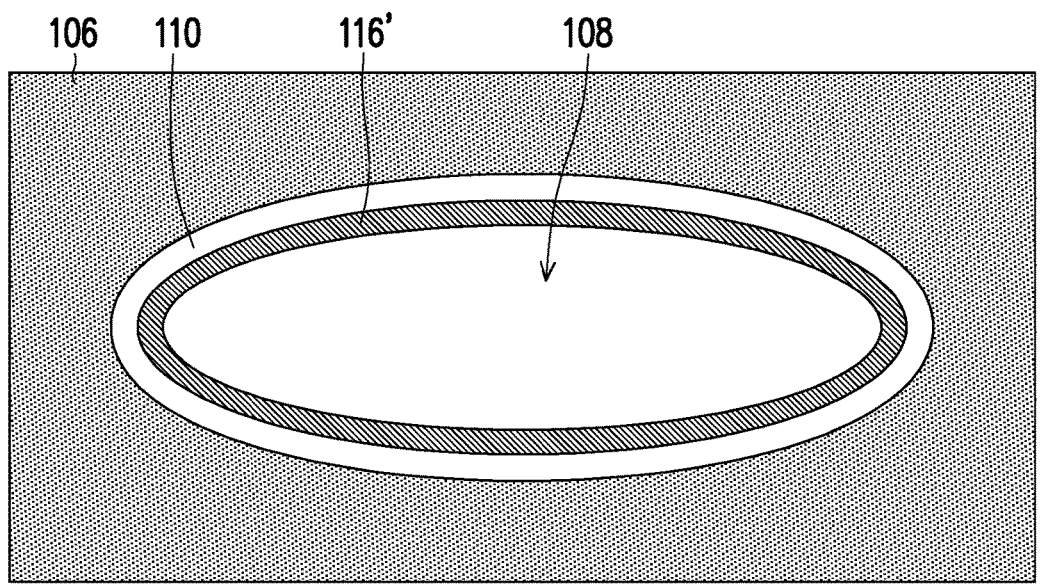
Figure 5B:
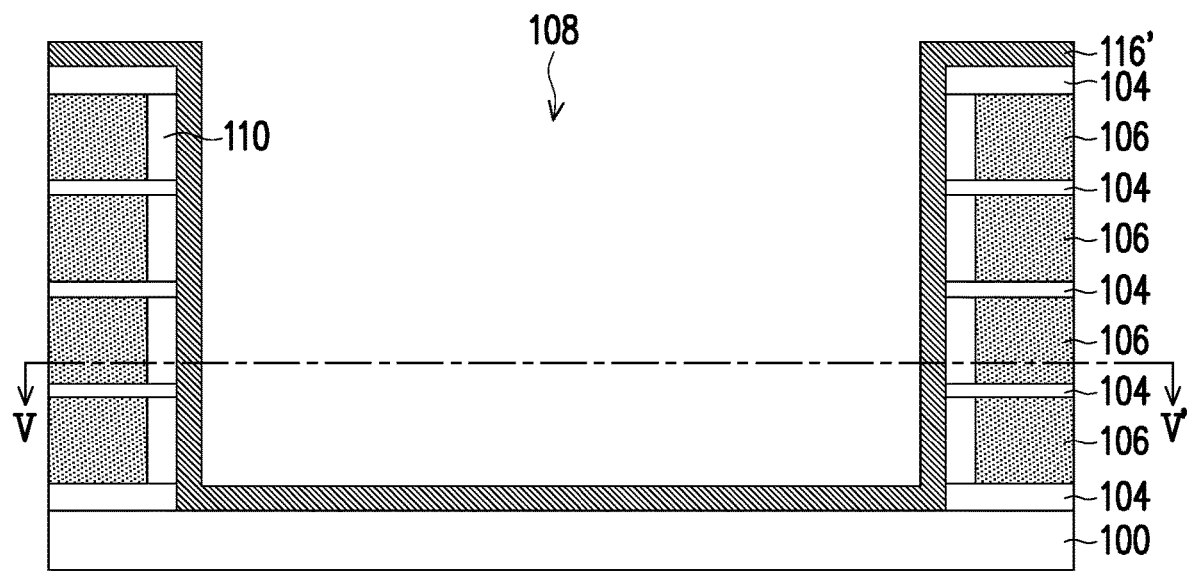
Figure 4C:
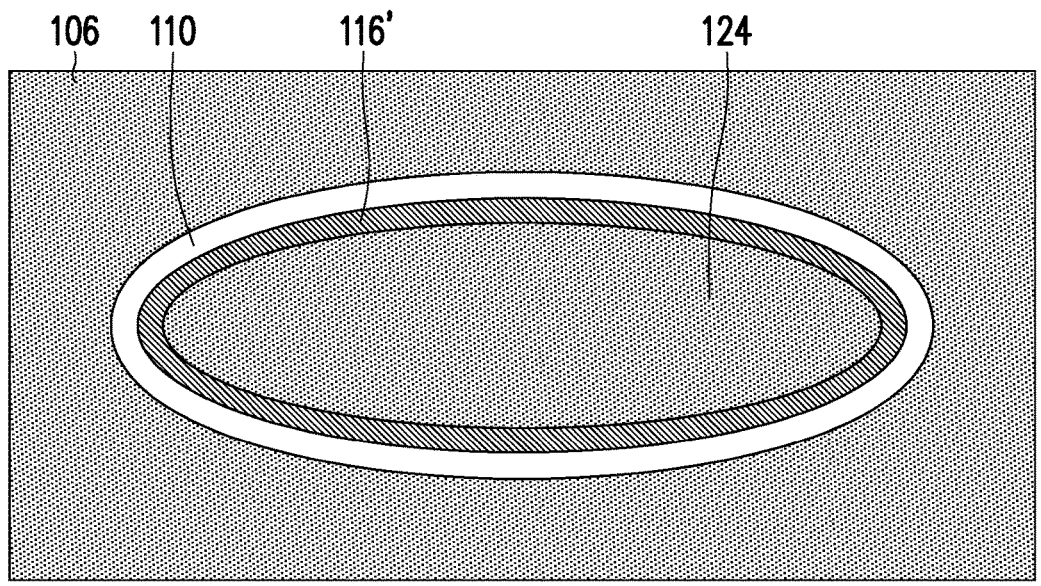
Figure 5C:
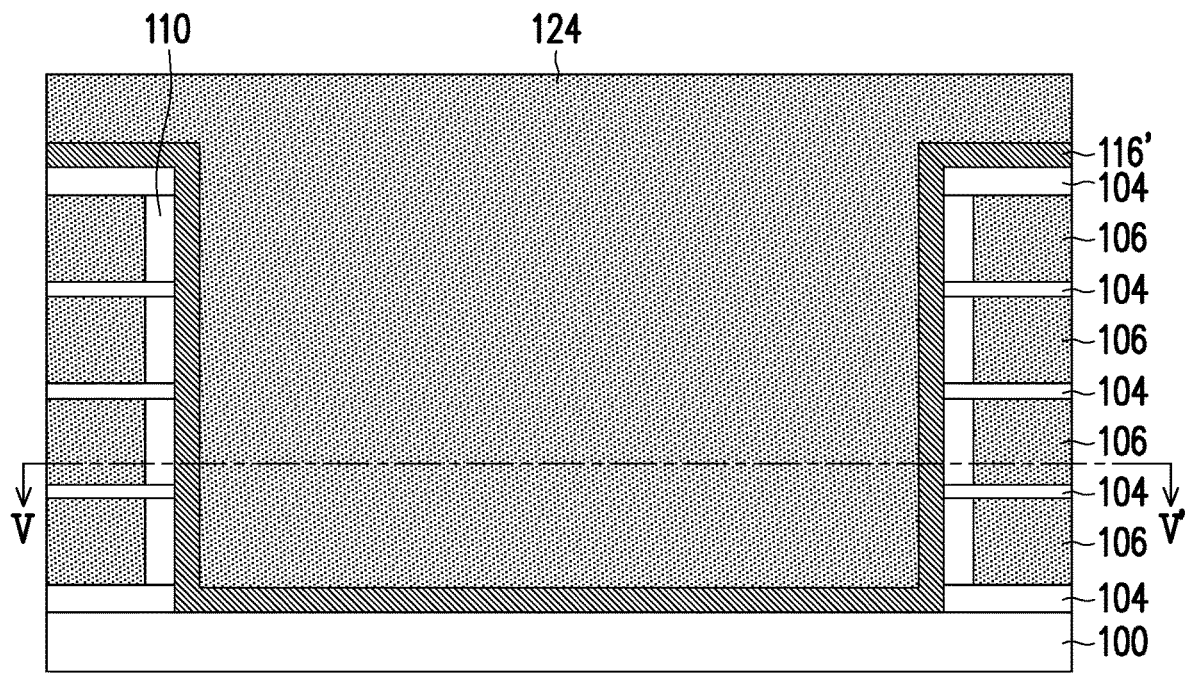
Figure 4D:
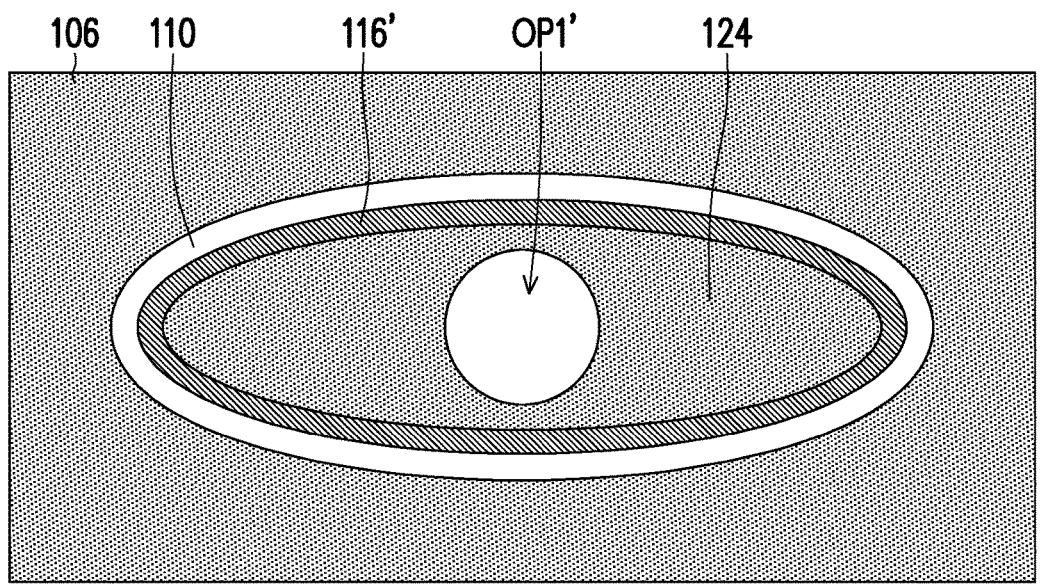
Figure 5D:
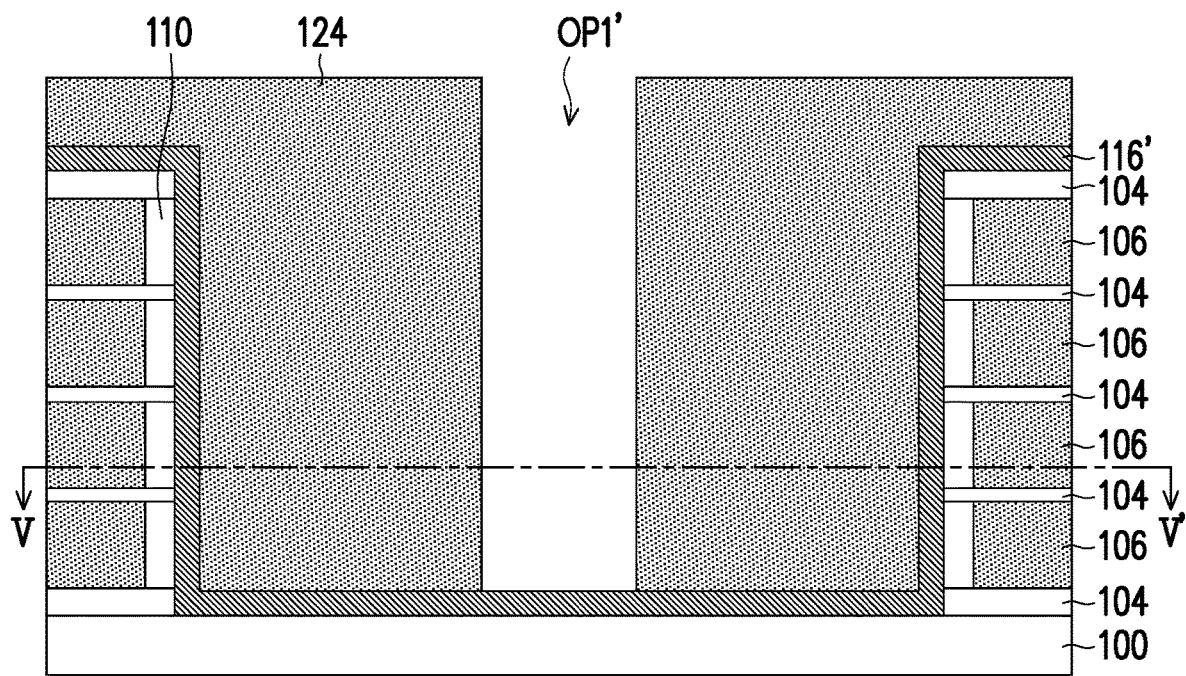
Figure 4E:
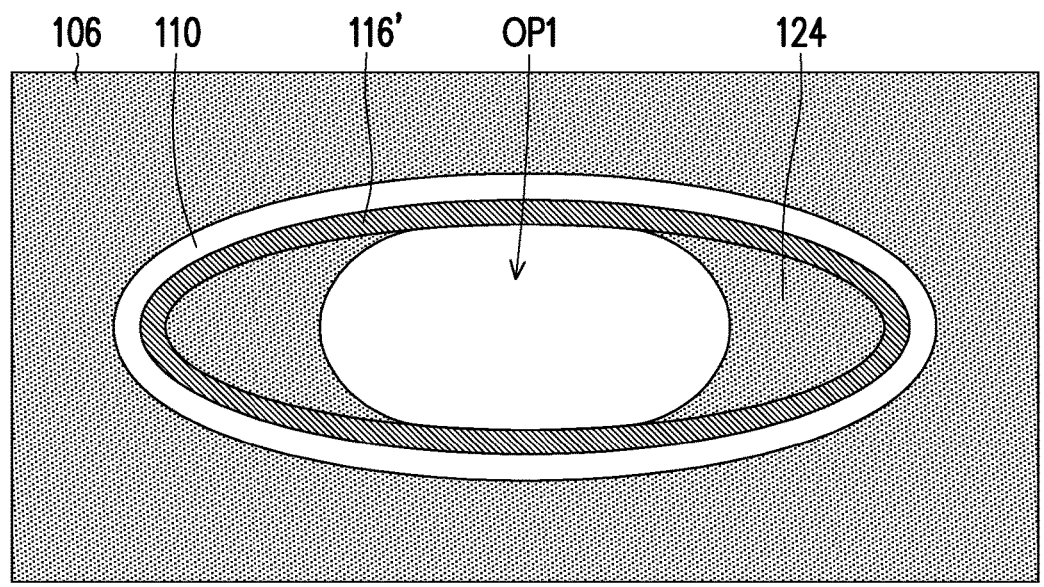
Figure 5E:
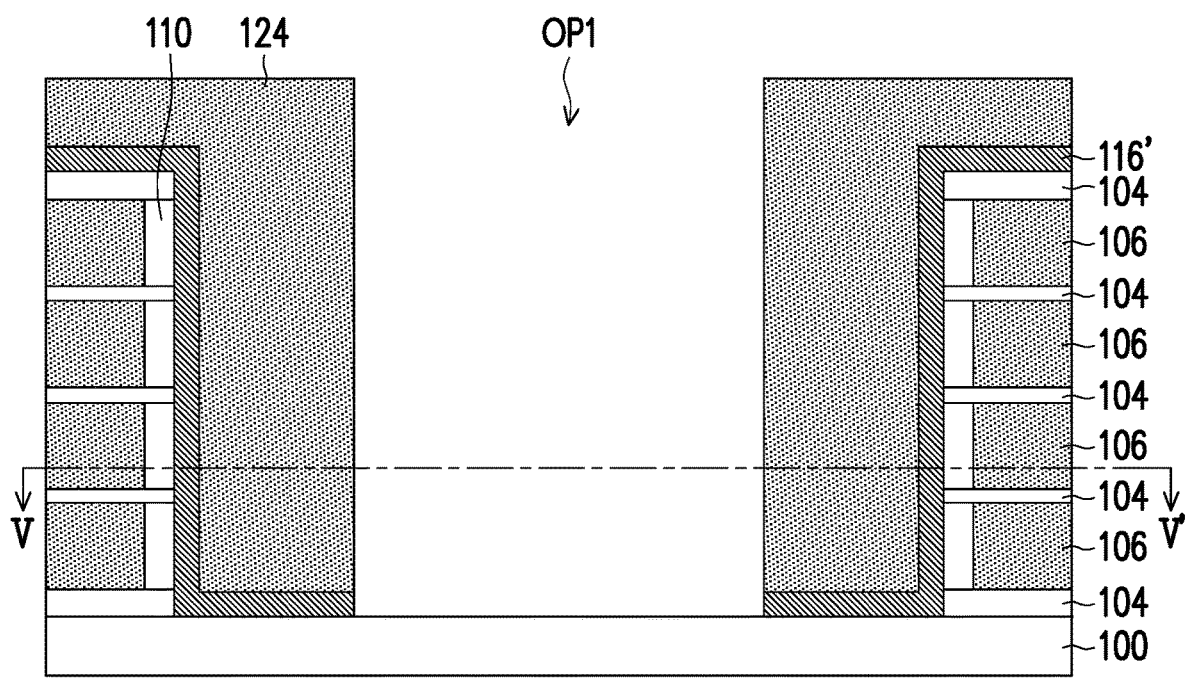
Figure 4F:
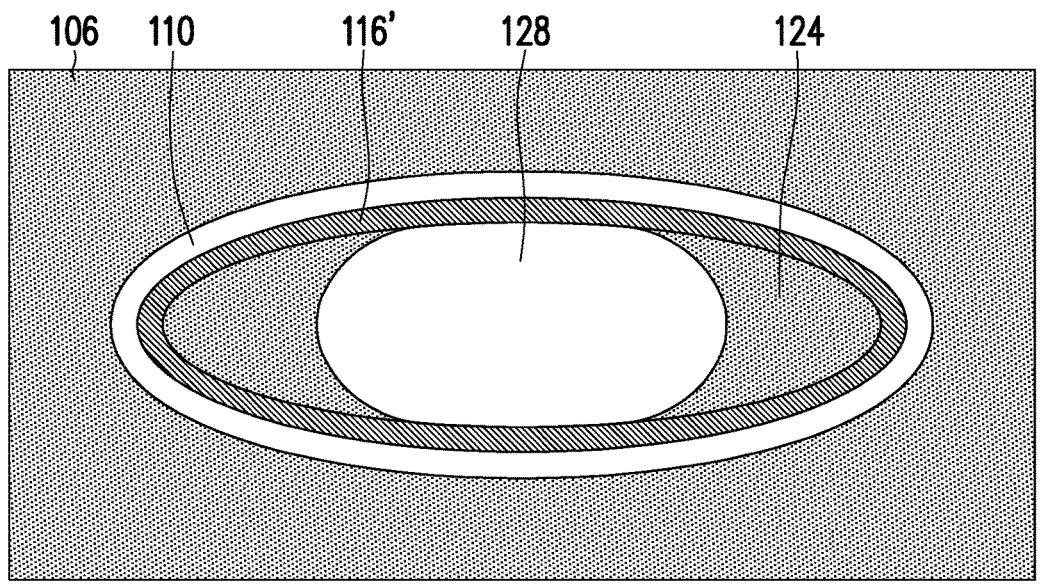
Figure 5F:
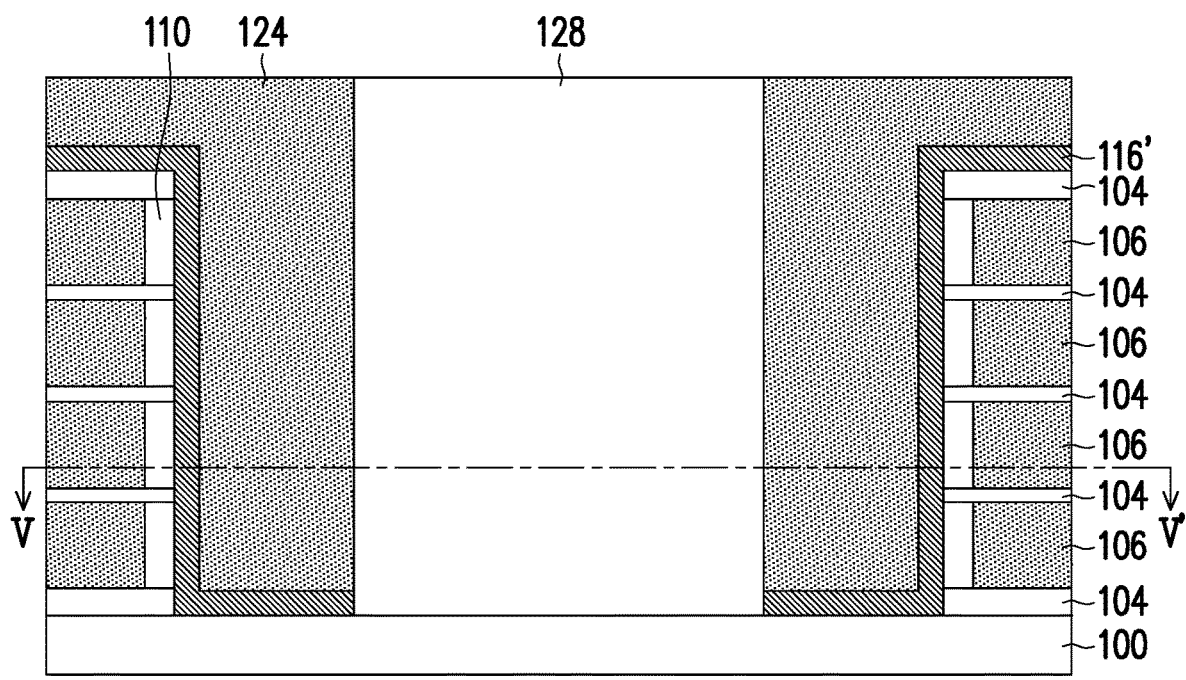
Figure 4G:
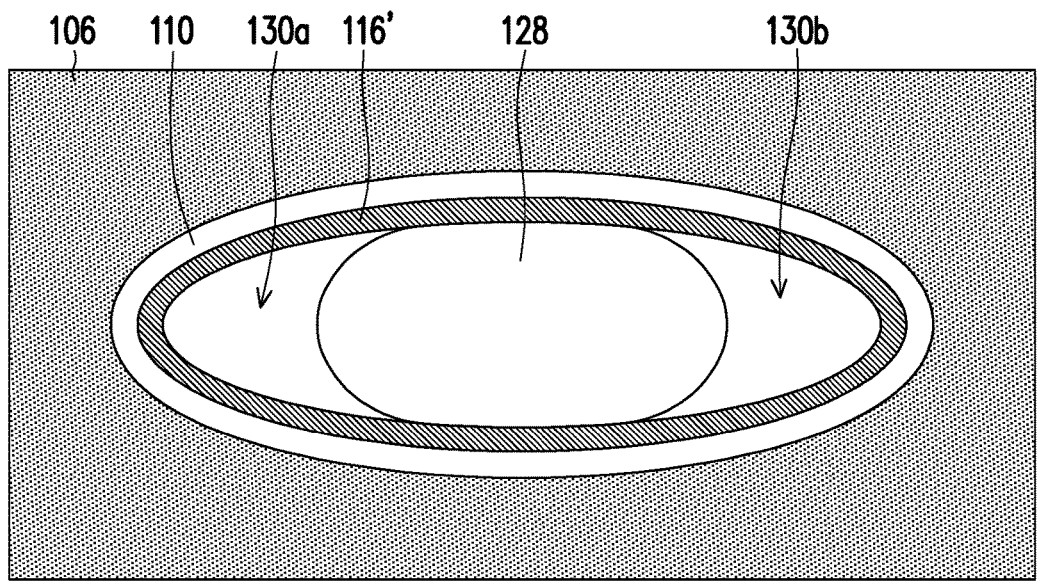
Figure 5G:
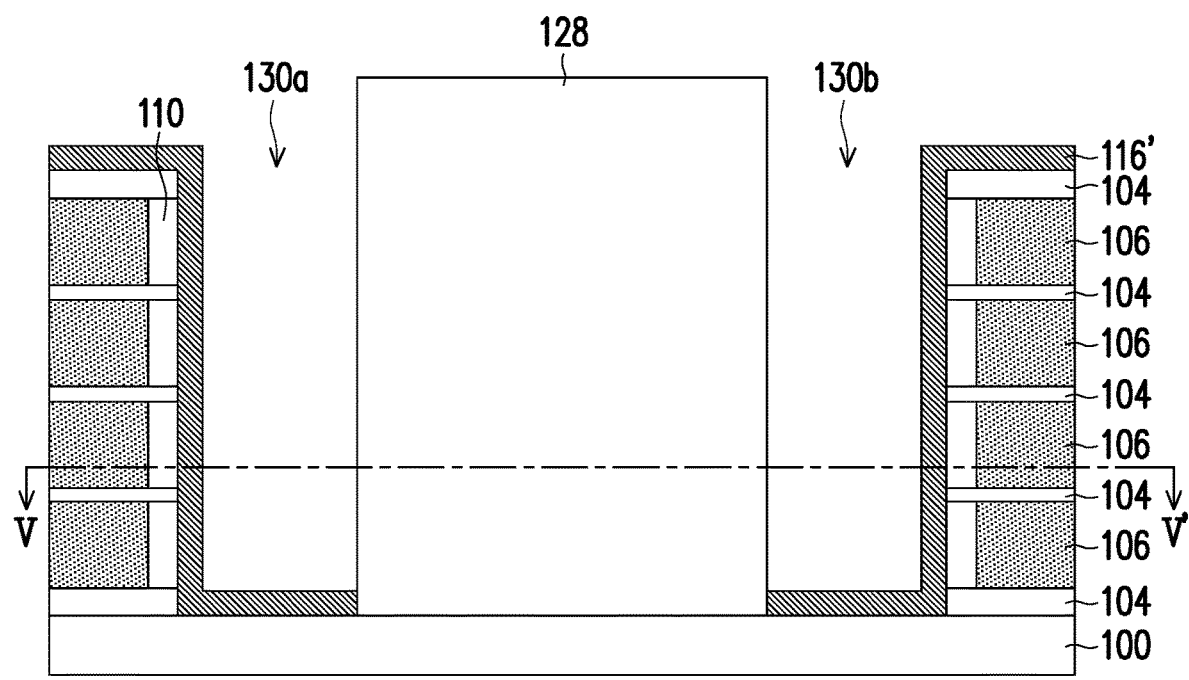
Figure 4H:
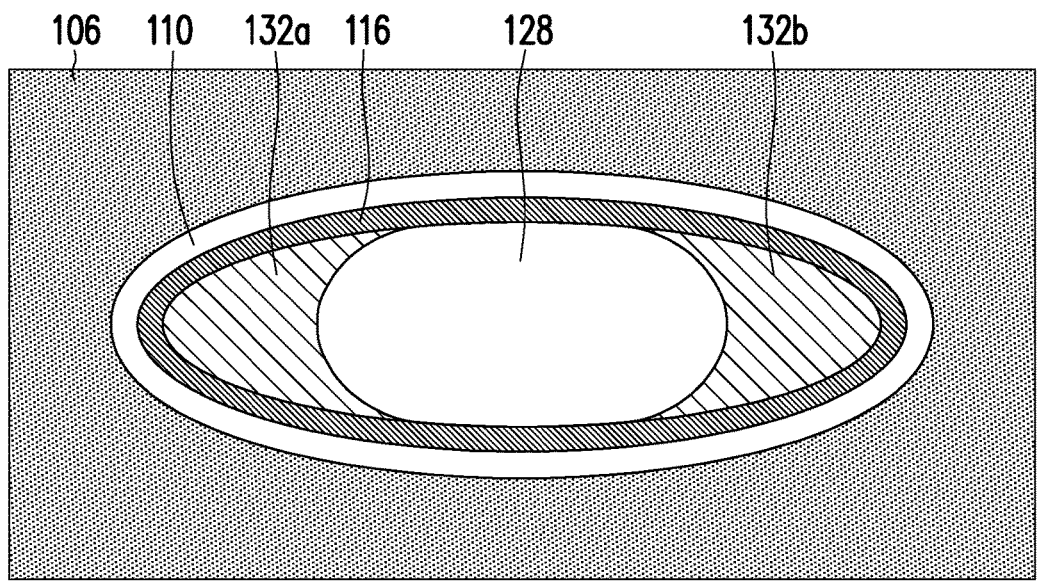
Figure 5H:
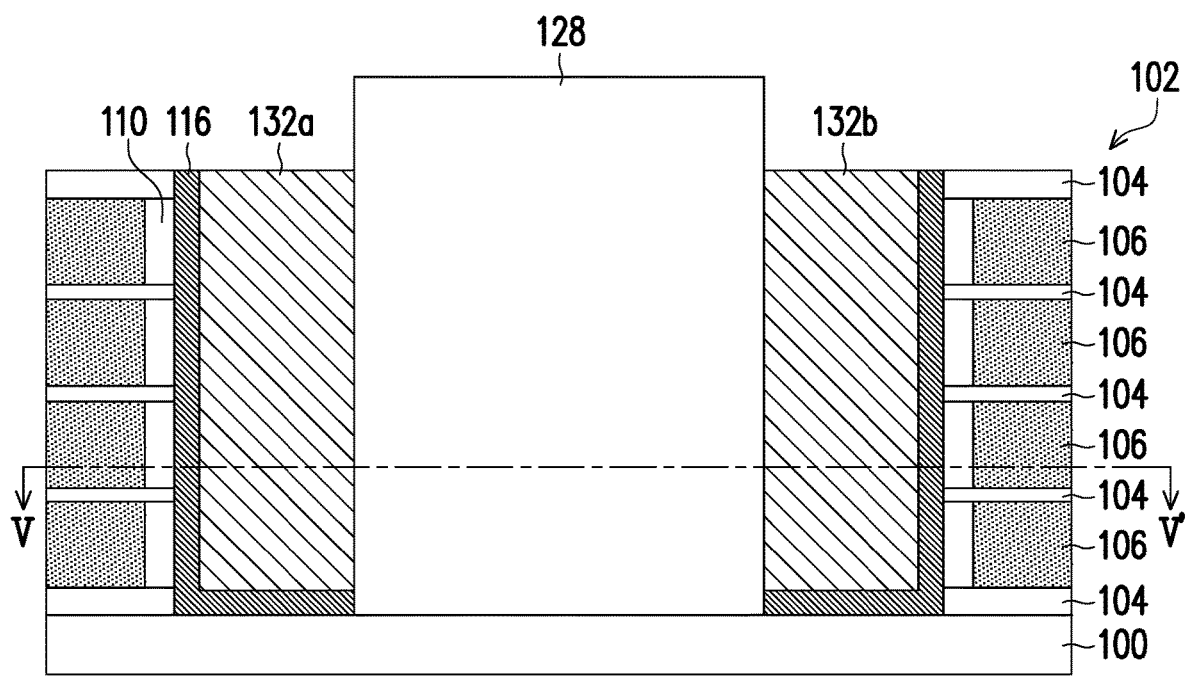
Figure 4I:
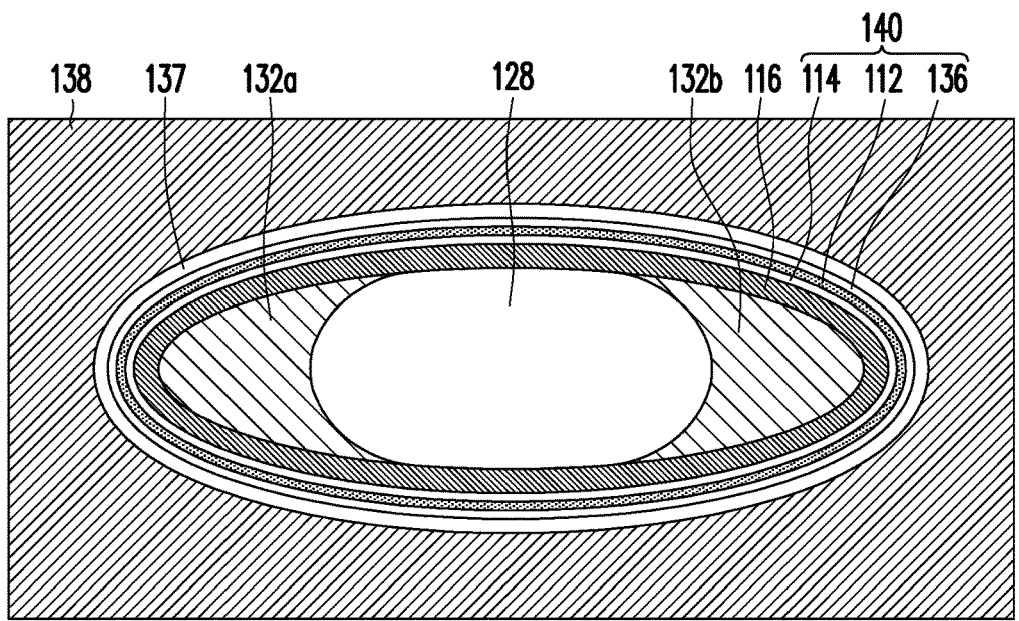
Figure 5I:
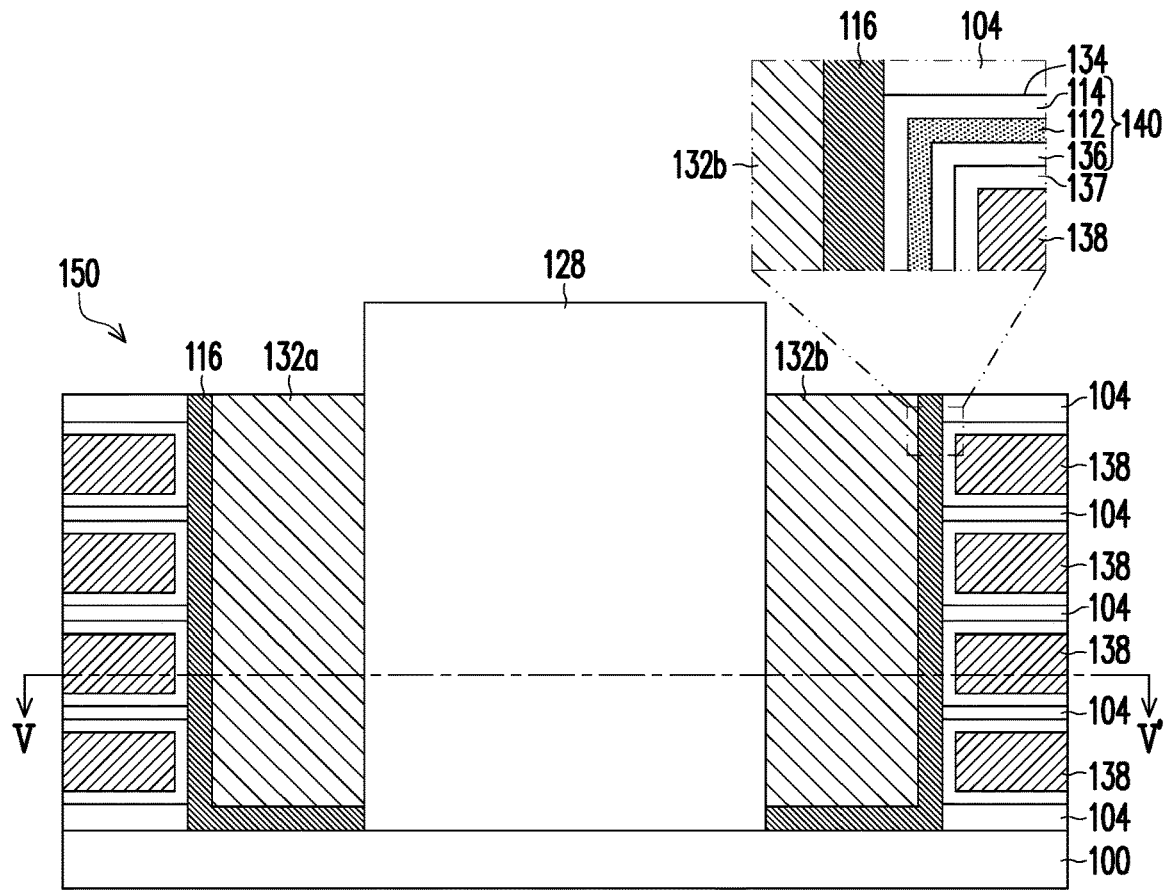

Afterwards, referring to FIG. 2I and FIG. 3I, a replacement process is performed. In some embodiment, the sacrificial layers 106 is replaced with a plurality of tunneling layers 114, a plurality of charge storage layers 112, and a plurality of gate layers 138 in the replacement process. First, a patterning process is performed on the stack structure 102 to form a plurality of slit trenches (not shown) therein, so that the stack structure 102 is divided into a plurality of blocks. Next, an etching process such as a wet etching process is performed by injecting an etching liquid into the slit trenches to sequentially remove the sacrificial layers 106 and form a plurality of horizontal openings 134. Afterwards, a tunneling material, a storage material, and a gate material are sequentially formed in the slit trenches and the horizontal openings 134. The material of the tunneling material is, for example, silicon oxide. The storage material is, for example, silicon nitride. The gate material is, for example, tungsten. Then, an etch-back process is performed to remove the tunneling material, the storage material, and the gate material in the slit trenches to form a plurality of tunneling layers 114, a plurality of charge storage layers 112, and a plurality of gate layers 138 in the horizontal openings 134.

In other embodiments, in the slit trenches (not shown) and the horizontal openings 134, in addition to the tunneling material, the storage material, and the gate material, a blocking material and a barrier material are further included between the storage material and the gate material. The material of the blocking material is, for example, a high dielectric constant material having a dielectric constant greater than or equal to 7, such as aluminum oxide ($Al_2O_3$), hafnium oxide ($HfO_2$), lanthanum oxide ($La_2O_5$), transition metal oxide, lanthanide oxide, or combinations thereof. The material of the barrier material is, for example, titanium (Ti), titanium nitride (TiN), tantalum (Ta), tantalum nitride (TaN), or a combination thereof. After an etch-back process is performed on the tunneling material, the storage material, the blocking material, the barrier material, and the gate material, a tunneling layer 114, a charge storage layer 112, a blocking layer 136, a barrier layer 137, and a gate layer 138 are formed in each of the horizontal openings 134. The blocking layer 136, the charge storage layer 112, and the tunneling layer 114 are collectively referred to as a charge storage structure 140. In a top view, an inner sidewall of tunneling layer 114 of the charge storage structure 140 is conformal with and in contact with the outer sidewall of the channel pillar 116.

At this time, a gate stack structure 150 is formed. The gate stack structure 150 is disposed on the dielectric substrate 100 and includes a plurality of gate layers 138 and a plurality of insulating layers 104 stacked alternately with each other.

The protection layer 110 (shown in FIG. 2H and FIG. 3H) may be optionally removed or retained. FIG. 2I and FIG. 3I show that the protection layer 110 is removed before the tunneling material is formed. However, the disclosure is not limited thereto. In other embodiments, the protection layer 110 may be retained (not shown).

The insulating filling layer 124 and the insulating pillar 128 of the embodiment of the disclosure include different materials. In some embodiments, the insulating filling layer 124 is silicon oxide, and the insulating pillar 128 is silicon nitride, as shown in FIG. 2A to FIG. 2I and FIG. 3A to FIG. 3I. In other embodiments, the insulating filling layer 124 is silicon nitride, and the insulating pillar 128 is silicon oxide, as shown in FIG. 4A to FIG. 4I and FIG. 5A to FIG. 5I. FIG. 4A to FIG. 4I are schematic top views of a process of fabricating a 3D AND flash memory device according to an embodiment of the disclosure. FIG. 4A to FIG. 4I are schematic top view taken along line V-V' in FIG. 5A to FIG. 5I.

Referring to FIG. 4A to FIG. 4D and FIG. 5A to FIG. 5D, an insulating filling layer 124 and an insulating pillar 128 are formed according to the methods of the above embodiment, and the insulating filling layer 124 is silicon nitride, and the insulating pillar 128 is silicon oxide.

Referring to FIG. 4E to FIG. 4G and FIG. 5E to FIG. 5G, the pull-back process for forming the opening OP1 and the etching process for removing the insulating filling layer 124 to form the holes 130a and 130b may both be a wet etching process using, for example, a hot phosphoric acid as the etchant.

In the above embodiment, the opening 108 is first sequentially filled with the channel material 116' and the insulating filling layer 124, and then the conductive layer serving as the source pillar and the drain pillar is formed. However, the disclosure is not limited thereto. In other embodiments, after the opening 108 is formed, the conductive layer serving as the source pillar and the drain pillar may be filled in the opening 108 first, and then the subsequent process is performed.

FIG. 6A to FIG. 6I are schematic top views of a process of fabricating a 3D AND flash memory device according to an embodiment of the disclosure. FIG. 6A to FIG. 6I are schematic top view taken along line VI-VI' in FIG. 7A to FIG. 7I.

Figure 6A:
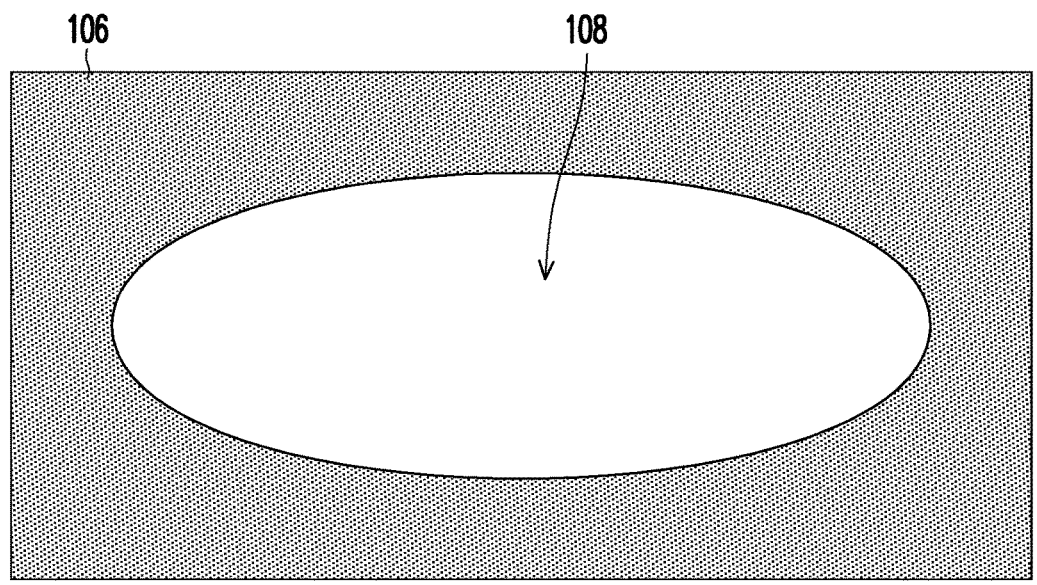
FIG. 6A to FIG. 6I are schematic top views of a process of fabricating a 3D AND flash memory device according to an embodiment of the disclosure.
Figure 7A:
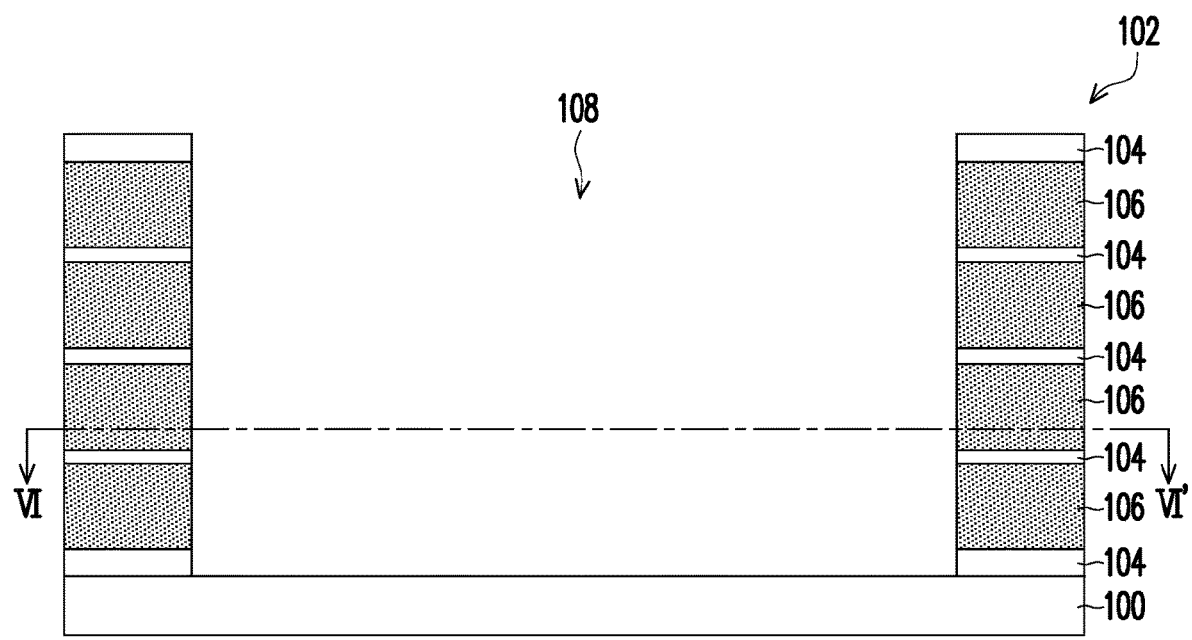
FIG. 7A to FIG. 7I are schematic cross-sectional view taken along line VI-VI' in FIG. 6A to FIG. 6I.
Figure 6B:
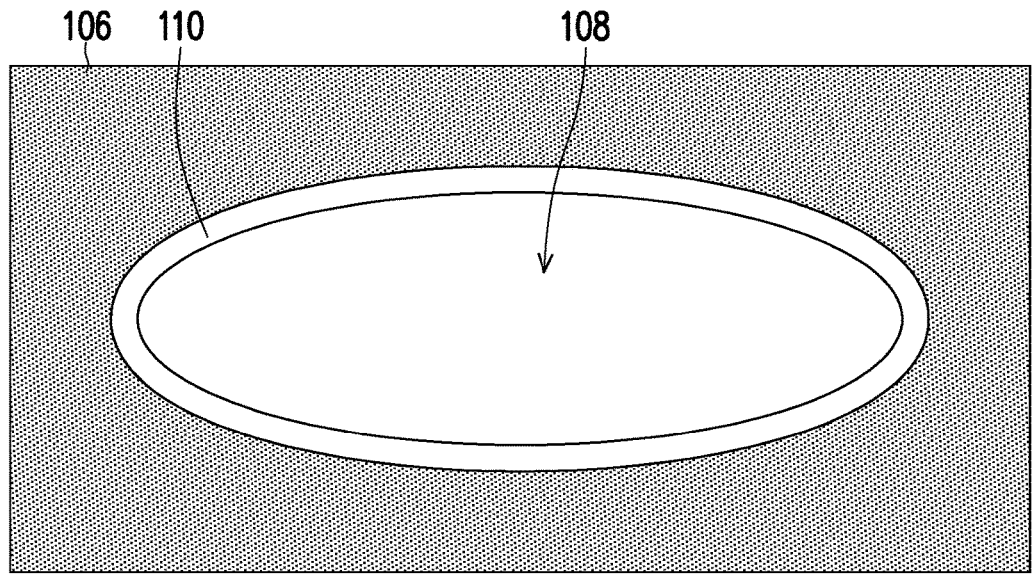
Figure 7B:
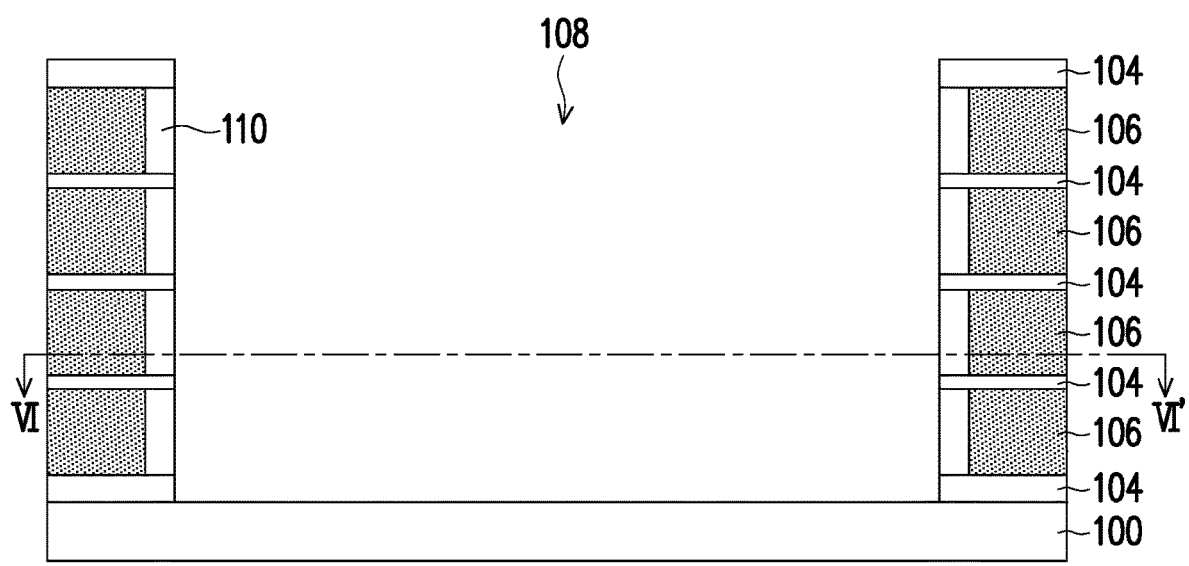

Referring to FIG. 6A, FIG. 6B, FIG. 7A and FIG. 7B, a stack structure 102 and an opening 108 (as shown in FIG. 6A and FIG. 7A) are formed according to the methods of the above embodiment, and a protection layer 110 (as shown in FIG. 6B and FIG. 7B) is formed on the sidewall of the sacrificial layer 106.

Figure 6C:
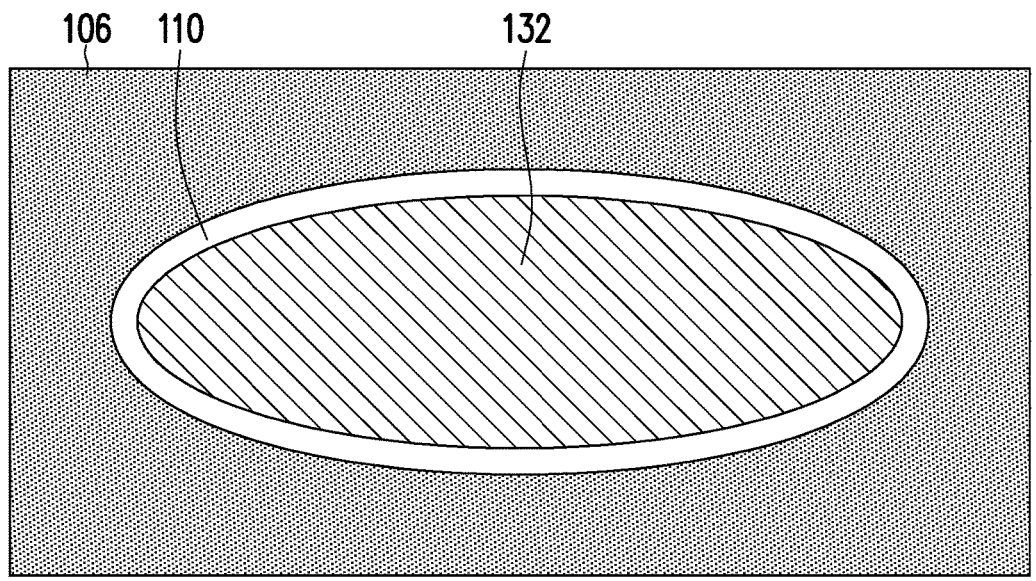
Figure 7C:
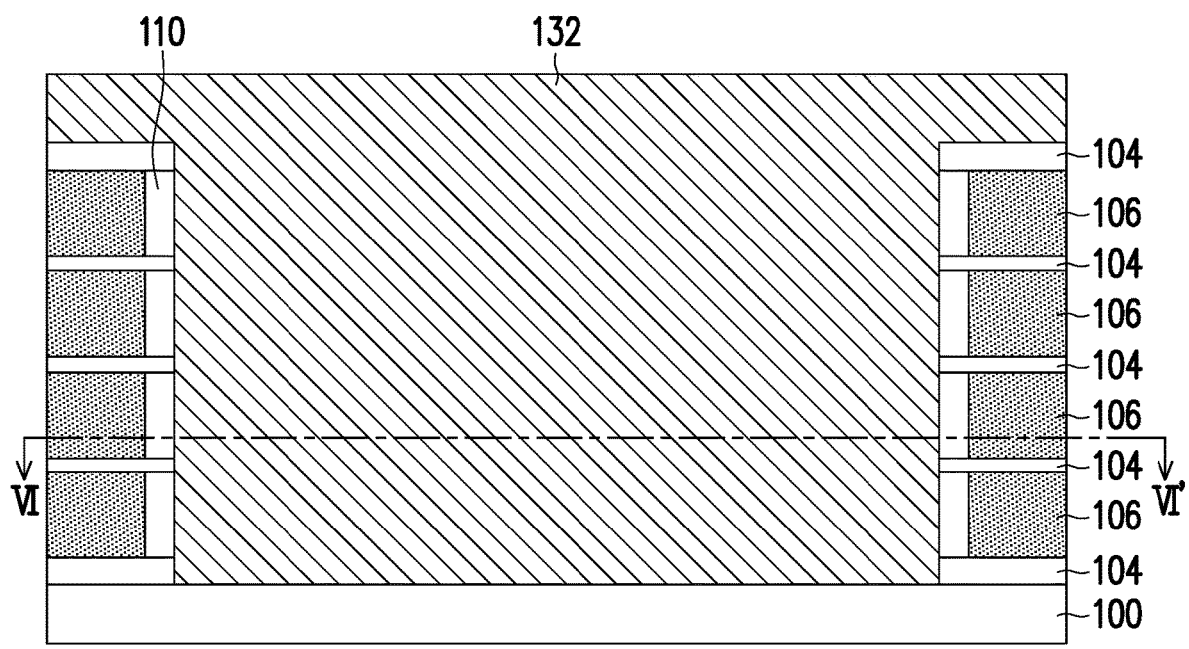

Referring to FIG. 6C and FIG. 7C, afterwards, the opening 108 is filled with a filling layer. In some embodiments, the filling layer is a conductive material (i.e., a conductive layer 132). The conductive layer 132 is, for example, doped polysilicon. The dopant in the doped polysilicon is, for example, N-type such as phosphorus or arsenic. The dopant in the doped polysilicon is, for example, P-type such as boron or boron trifluoride.

Figure 6D:
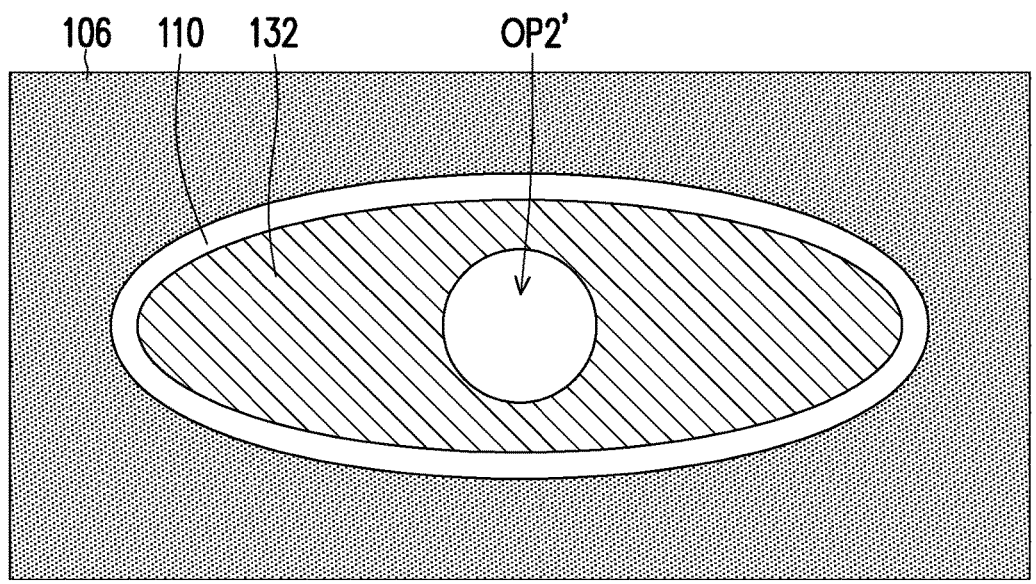
Figure 7D:
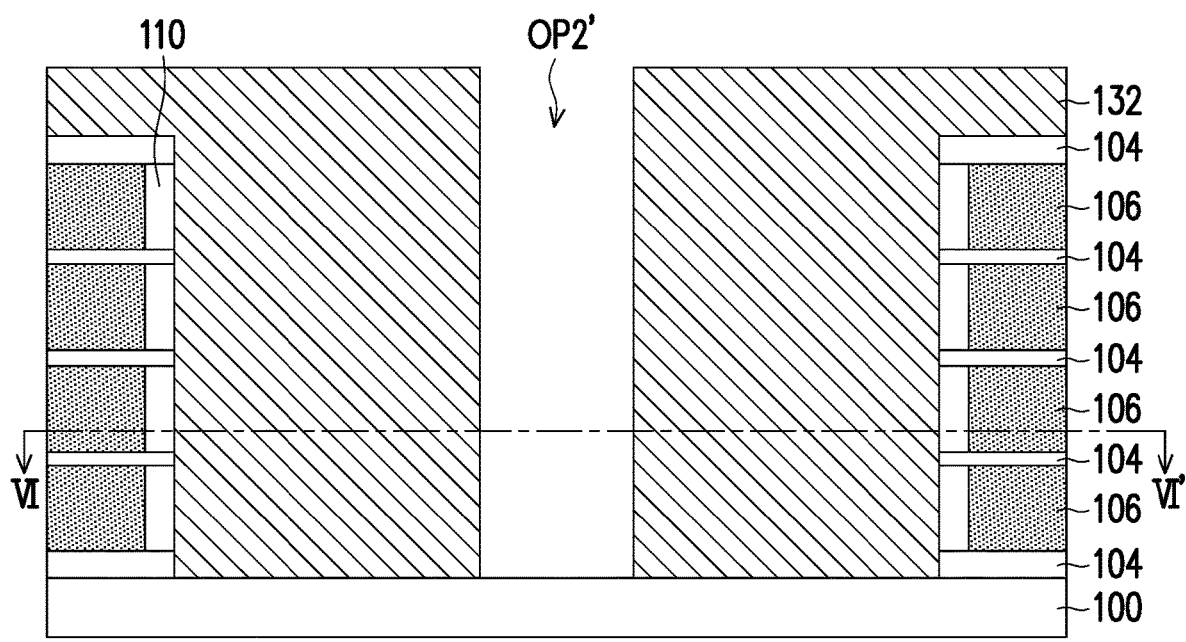

Referring to FIG. 6D and FIG. 7D, an opening OP2' is formed in the conductive layer 132 through photolithography and etching processes. The opening OP2' is circular, for example. The etching process is, for example, an anisotropic etching process such as a dry etching process.

Figure 6E:
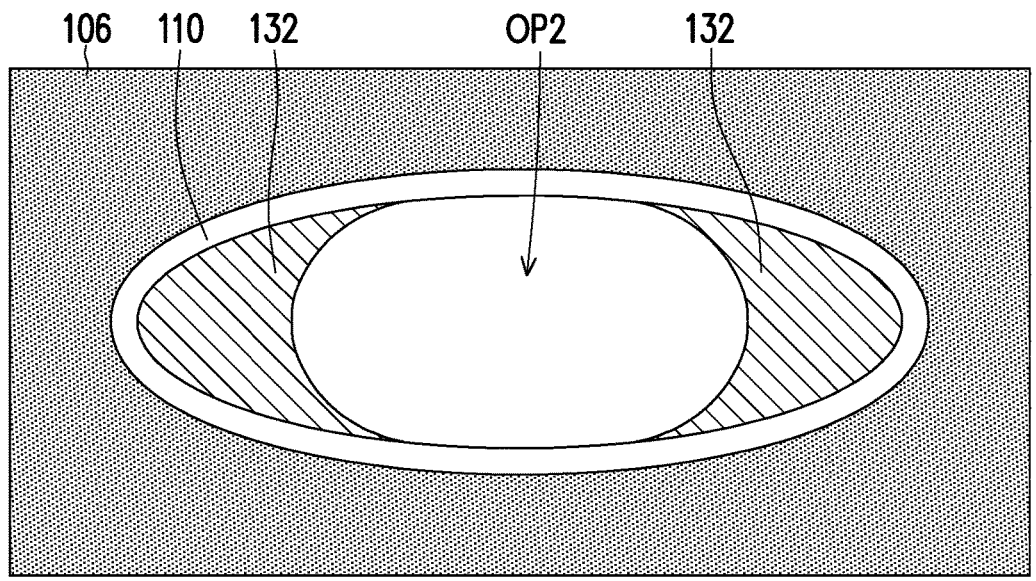
Figure 7E:
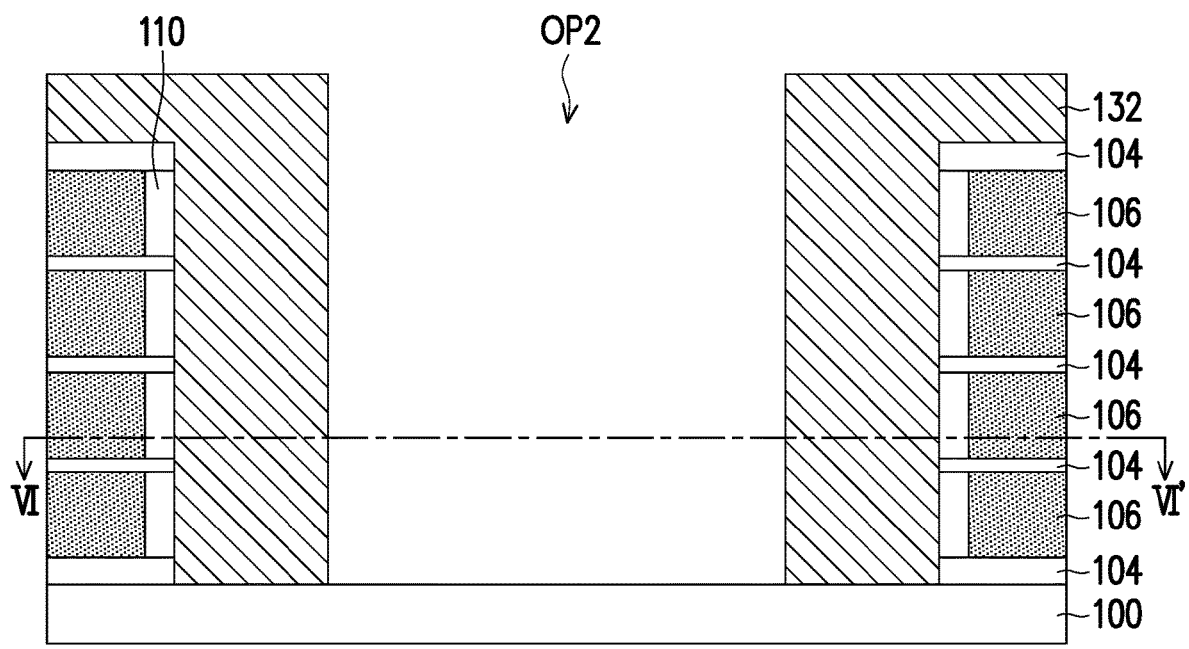
Figure 7F:
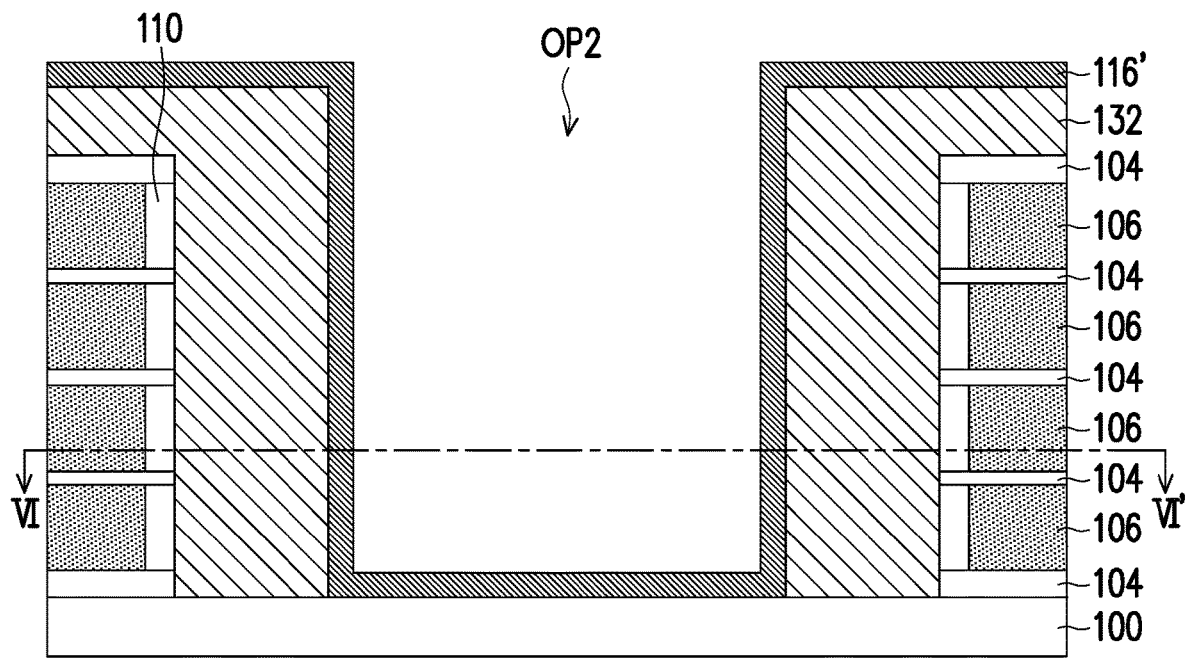
Figure 7G:
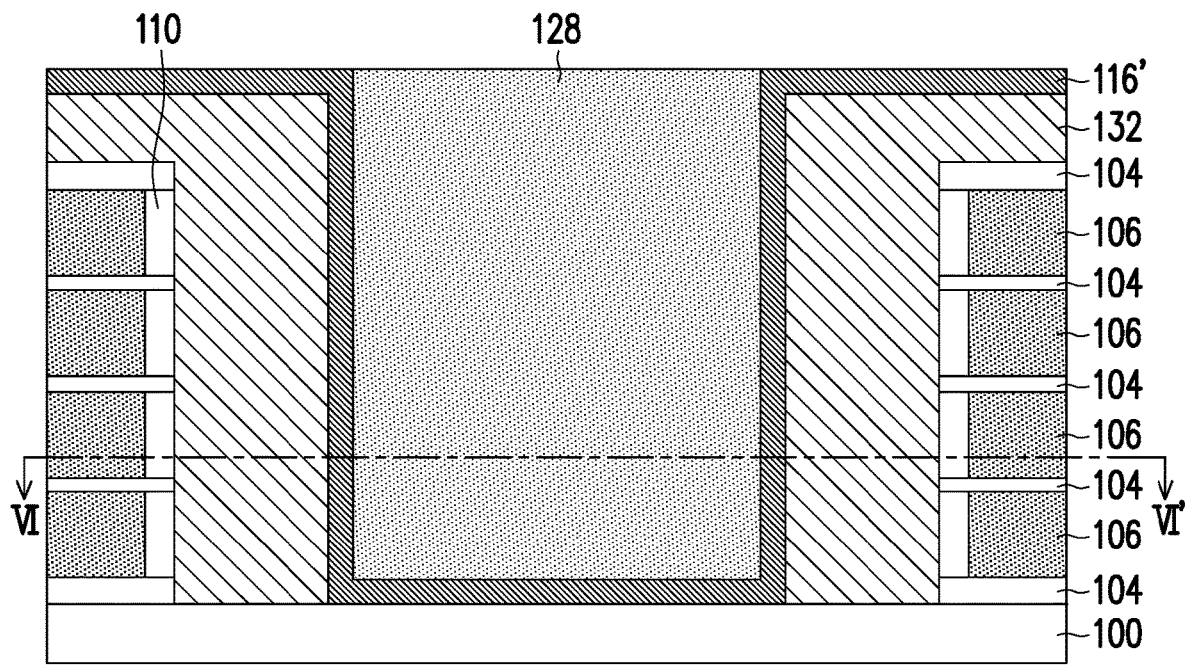

Referring to FIG. 6E and FIG. 7E, a pull-back process such as an etching process is performed to remove a portion of the conductive layer 132 around the opening OP2', so that the opening OP2' is flared to form an opening OP2. The pull-back process may be an isotropic etching process such as a wet etching process. In contrast to the above dry etching process for forming the opening OP2', a wet etching process is adopted for forming the opening OP2, so that a higher etch selectivity between the protection layer 110 and the conductive layer 132 can be obtained. Therefore, during the pull-back process, in the short-axis direction of the opening 108, the protection layer 110 may serve as a stop layer; in the long-axis direction of the opening 108, the conductive layer 132 may be continuously etched. Therefore, the opening OP2 has a long axis and a short axis. The opening OP2 has an elliptical profile, for example, but the disclosure is not limited thereto. In other embodiments, the opening OP2 may have a profile of other shapes such as a polygonal shape (not shown). The sidewall of the opening OP2 in the short-axis direction exposes the protection layer 110; the sidewall of the opening OP2 in the long-axis direction exposes the conductive layer 132; the bottom of the opening OP2 exposes the dielectric substrate 100. The conductive layer 132 will be used to form a source pillar and a drain pillar.

Since the channel material 116' (shown in FIG. 6F and FIG. 7F) is formed after the opening 108 (shown in FIG. 6B and FIG. 7B) is formed, and the channel material 116' does not have the issue of etching damage. In the process of forming the opening OP2, with the high etch selectivity between the conductive layer 132 and the protection layer 110, after the pull-back process, even if the opening OP2 exposes the protection layer 110, the protection layer 110 is hardly damaged and has a smooth sidewall. The channel pillar 116 (FIG. 6H and FIG. 7H) subsequently formed on the sidewall of the protection layer 110 exposed by the opening OP2 will serve as the channel region.

Referring to FIG. 6F, FIG. 6G, FIG. 7F and FIG. 7G, a channel material 116' is formed on the conductive layer 132 and in the opening OP2. Then, an insulating material such as silicon oxide is formed in the opening OP2 to completely seal the opening OP2. The insulating material is etched back through a dry etching or wet etching process until the surface of the channel material 116' is exposed to form an insulating pillar 128. Since the channel material 116' is formed on the smooth sidewall of the protection layer 110, the portion (which will serve as the channel region) of the formed channel material 116' that is in contact with the protection layer 110 also has a smooth sidewall. The insulating pillar 128 separates the filling layer (the conductive layer 132) into two sub-filling layers, and the two sub-filling layers form the conductive pillar 132a and 132b as shown in FIG. 6H and FIG. 7H.

Figure 6F:
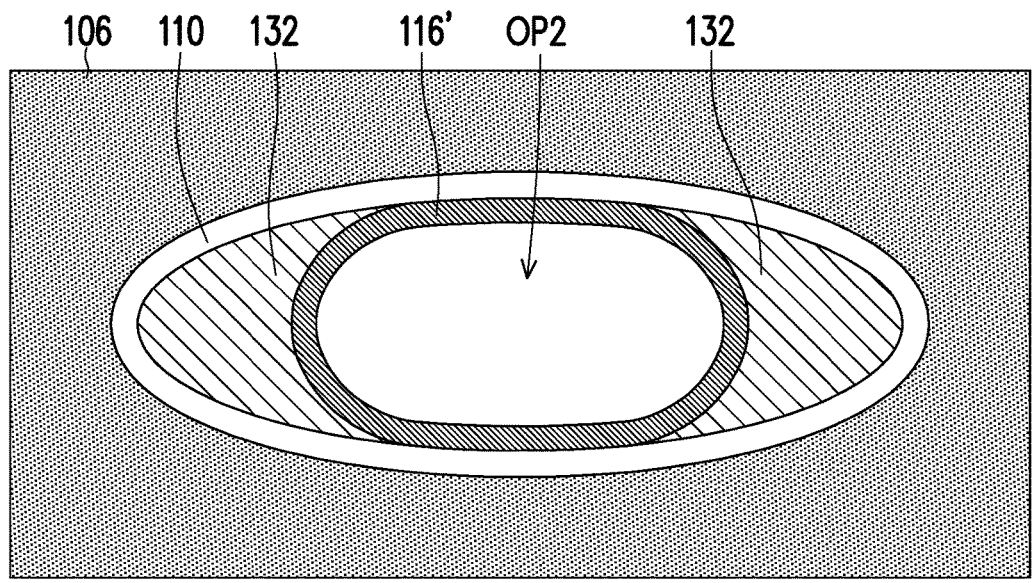
Figure 6G:
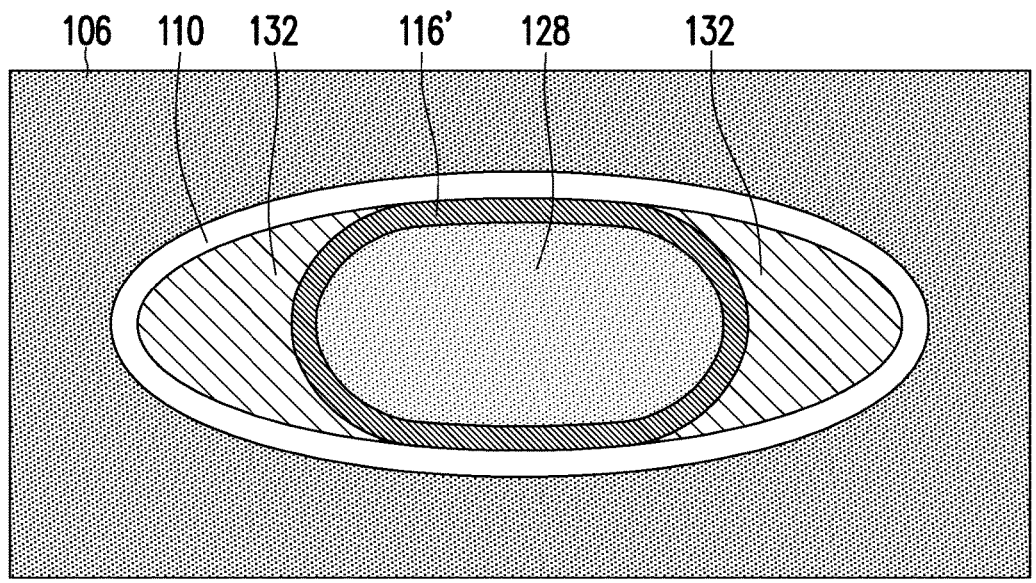
Figure 6H:
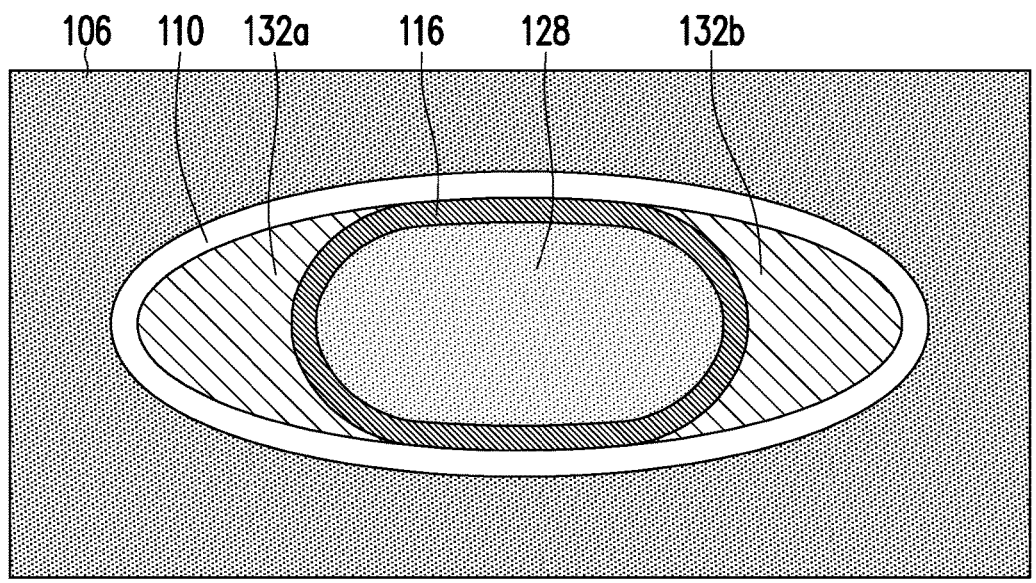
Figure 7H:
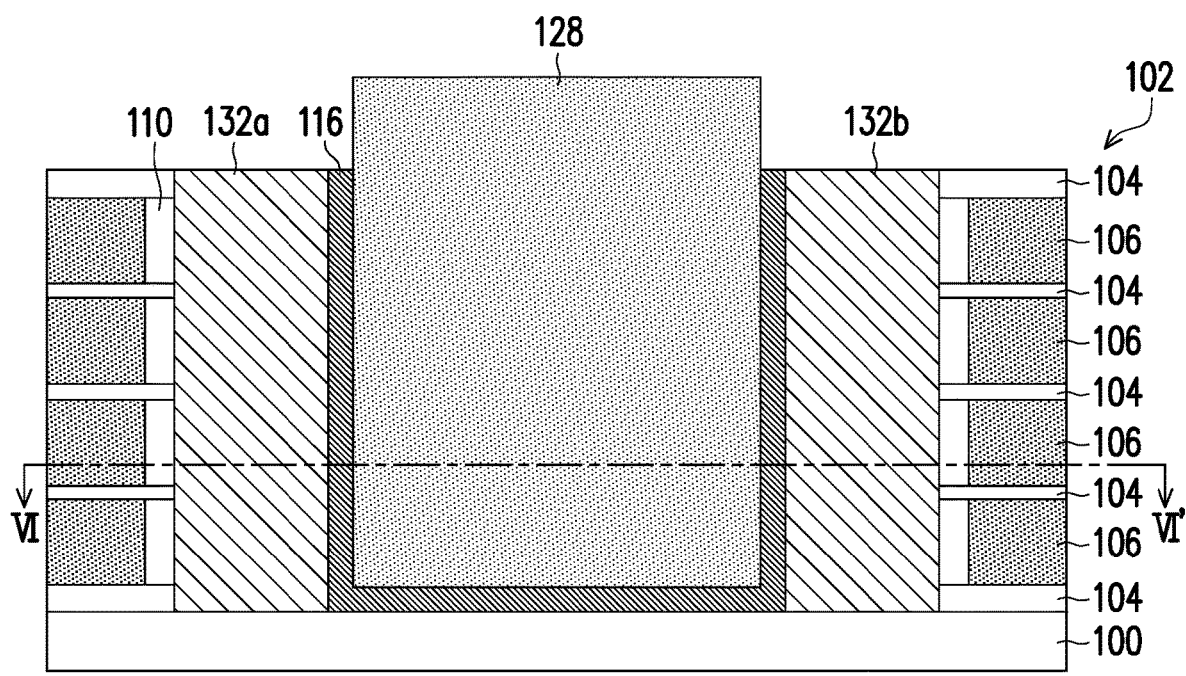

Referring to FIG. 6H and FIG. 7H, the channel material 116' and the conductive layer 132 are etched back through a dry etching or wet etching process until the surface of the stack structure 102 is exposed to form a channel pillar 116 and conductive pillars 132a and 132b. The channel pillar 116 surrounds the sidewall of the insulating pillar 128. The conductive pillars 132a and 132b may respectively serve as a source pillar and a drain pillar. The conductive pillars 132a and 132b are separated by the insulating pillar 128. Sidewalls of the conductive pillars 132a and 132b on one side are electrically connected to the channel pillar 116, and sidewalls of the conductive pillars 132a and 132b on another side are in contact with the protection layer 110.

Figure 6I:
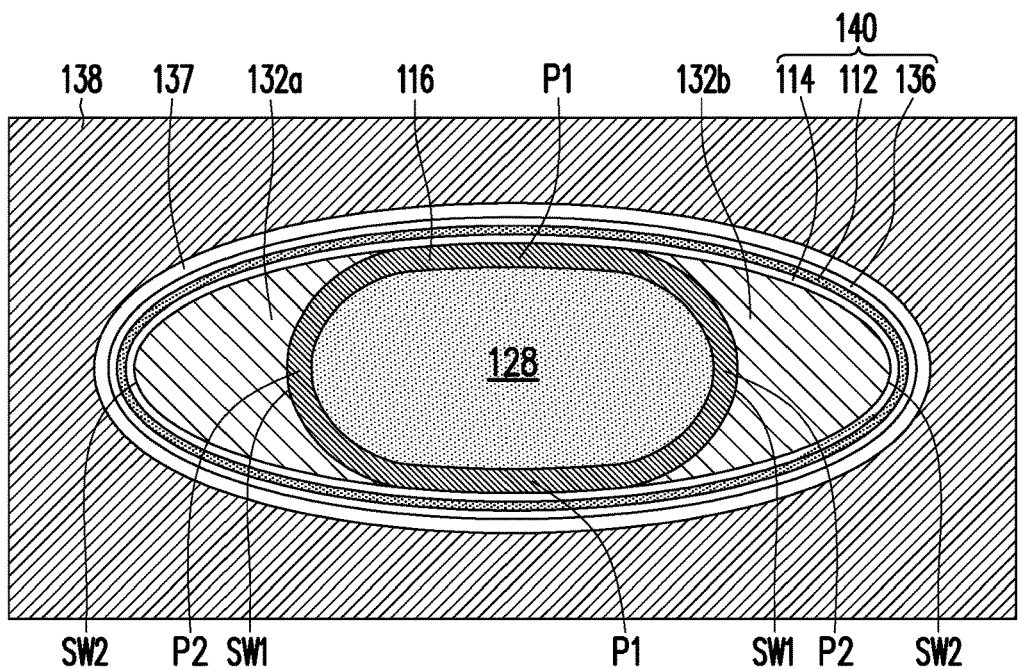
Figure 7I:
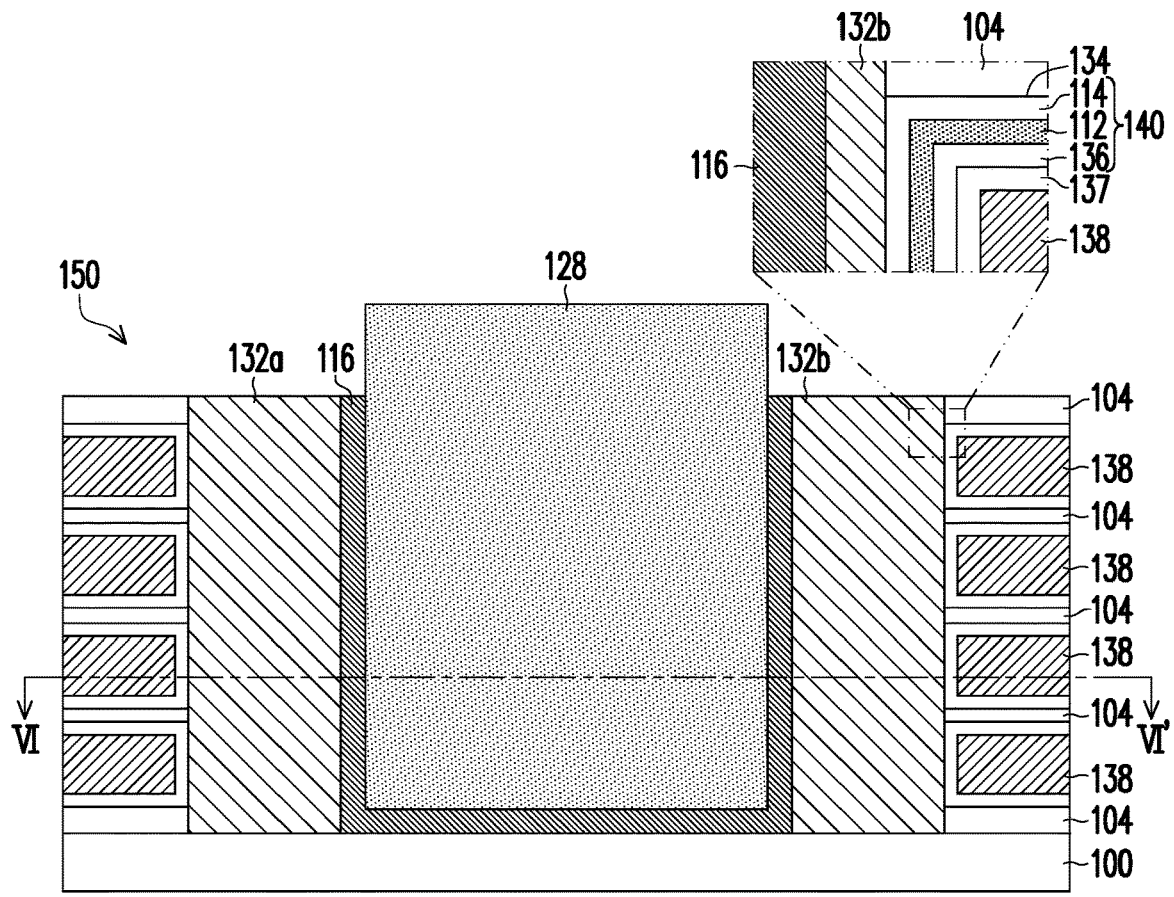

Afterwards, referring to FIG. 6I and FIG. 7I, a replacement process is performed according to the above method. In some embodiments, the sacrificial layer 106 is replaced with a tunneling layer 114, a charge storage layer 112, and a gate layer 138 in the replacement process. In other embodiments, the sacrificial layer 106 is replaced with a tunneling layer 114, a charge storage layer 112, a blocking layer 136, a barrier layer 137, and a gate layer 138 in the replacement process. Likewise, the protection layer 110 may be optionally removed (as shown in FIG. 6I and FIG. 7I) or retained (not shown). One sidewall SW1 of the conductive pillars 132a or 132b is respectively electrically connected to the channel layer 116, and another sidewall SW2 of the conductive pillars 132a or 132b is respectively in contact with the tunneling layer 114. In some embodiments, a portion of the channel layer 116 that is in contact with the tunneling layer 114 serves as the channel region and has a smooth sidewall. The volumes of the first conductive pillar 132a and the conductive pillar 132b are substantially the same as the volumes of the spaces between the insulating pillar 128 and the charge storage structure 140.

In the above embodiments, the charge storage layer 112 and the tunneling layer 114 are formed in the horizontal opening 134. However, the disclosure is not limited thereto. In other embodiments, the charge storage layer 112 and the tunneling layer 114 may also be formed after the opening 108 is formed and before the channel material 116' is formed. The above embodiments have been described by taking a 3D AND flash memory device as an example. However, the embodiment of the disclosure is not limited thereto. The disclosure may also be applied to a 3D NOR flash memory.

The channel pillar of the flash memory device of the embodiment of the disclosure has an elongated profile in a top view. The first part of the channel pillar that serves as the channel region has a smaller curvature, which can reduce the effect of the electric field and reduce the disturbance to the current in its traveling direction. Therefore, it is possible to improve the accuracy of memory reading.

In the method of fabricating the flash memory device of the embodiment of the disclosure, the etching process for forming the source pillar and the drain pillar is performed before the channel pillar is formed. Therefore, the channel pillar is not damaged by etching during the formation of the source pillar and the drain pillar.

What is claimed is:

1. A three-dimensional AND flash memory device, comprising:
    a gate stack structure located on a surface of a dielectric substrate, wherein the gate stack structure comprises a plurality of gate layers and a plurality of insulating layers alternately stacked with each other;
    a first conductive pillar and a second conductive pillar extending through the gate stack structure;
    an insulating pillar separating the first conductive pillar and the second conductive pillar;
    a channel pillar extending through the gate stack structure; and
    a charge storage structure disposed between the gate stack structure and the channel pillar, wherein the channel pillar, the first conductive pillar, the second conductive pillar and the insulating pillar are enclosed by and in the charge storage structure;
    wherein the channel pillar comprises:
        a first part located between the charge storage structure and the insulating pillar; and
        a second part comprising a first region electrically connected to the first conductive pillar and a second region electrically connected to the second conductive pillar,
        wherein the first part is connected to the second part, and a curvature of the first part is smaller than a curvature of the second part,
    wherein the insulating pillar comprises a first sidewall connected to the first part and a second sidewall connected to the first conductive pillar and the second conductive pillar, and the first sidewall is connected to the second sidewall,
    wherein a projection of the insulating pillar on the surface of the dielectric substrate has an entirely elliptical profile.

2. The three-dimensional AND flash memory device according to claim 1, wherein a projection of the channel pillar on the surface of the dielectric substrate has an elliptical profile.

3. The three-dimensional AND flash memory device according to claim 2, wherein the first conductive pillar and the second conductive pillar are disposed on a long axis of the elliptical profile.

4. The three-dimensional AND flash memory device according to claim 1, wherein the channel pillar is conformal with and in contact with a tunneling layer of the charge storage structure.

5. The three-dimensional AND flash memory device according to claim 4, wherein the first conductive pillar and the second conductive pillar are located between the insulating pillar and the second part of the channel pillar.

6. The three-dimensional AND flash memory device according to claim 5, wherein volumes of the first conductive pillar and the conductive pillar are substantially the same as volumes of the spaces between the insulating pillar and the second portion of the channel pillar.

7. The three-dimensional AND flash memory device according to claim 1, wherein an inner sidewall of the channel pillar is conformal with an outer sidewall of the insulating pillar.

8. The three-dimensional AND flash memory device according to claim 7, wherein the first conductive pillar and the second conductive pillar are located between the second part of the channel pillar and the charge storage structure.

9. The three-dimensional AND flash memory device according to claim 8, wherein volumes of the first conductive pillar and the conductive pillar are substantially the same as volumes of the spaces between the insulating pillar and the charge storage structure.

10. A three-dimensional AND flash memory device, comprising:

a gate stack structure located on a surface of a dielectric substrate, wherein the gate stack structure comprises a plurality of gate layers and a plurality of insulating layers alternately stacked with each other;

a channel pillar extending through the gate stack structure, wherein a projection of the channel pillar on the surface of the dielectric substrate has an elliptical profile;

a charge storage structure located between the gate layers and the channel pillar;

an insulating pillar located in the channel pillar; and a source pillar and a drain pillar disposed on a long axis of the elliptical profile and extending through the gate stack structure, surrounded by the charge storage structure and separated by the insulating pillar, and electrically connected to the channel pillar, wherein the insulating pillar comprises a first sidewall connected to the channel pillar and a second sidewall connected to the source pillar and the drain pillar, and the first sidewall is connected to the second sidewall, wherein a projection of the insulating pillar on the surface of the dielectric substrate has an entirely elliptical profile.

11. The three-dimensional AND flash memory device according to claim 10, wherein a projection of the charge storage structure on the surface of the dielectric substrate has an entirely elliptical profile.

* * * * *